(12) United States Patent
Weidman et al.

(10) Patent No.: US 10,599,040 B2
(45) Date of Patent: Mar. 24, 2020

(54) LITHOGRAPHIC APPARATUS AND ASSOCIATED METHOD

(71) Applicant: ASML NETHERLANDS B.V., Veldhoven (NL)

(72) Inventors: James Malcolm Weidman, Clifton Park, NY (US); Franciscus Johannes Blok, Hoogeloon (NL); Erika Jane Prime, Eindhoven (NL); Juliane Charlotte Behrend, Eindhoven (NL)

(73) Assignee: ASML Netherland B.V., Veldhoven (NL)

( * ) Notice: Subject to any disclaimer, the term of this patent is extended or adjusted under 35 U.S.C. 154(b) by 0 days.

(21) Appl. No.: 16/040,808

(22) Filed: Jul. 20, 2018

(65) Prior Publication Data

US 2019/0056669 A1 Feb. 21, 2019

Related U.S. Application Data

(60) Provisional application No. 62/635,976, filed on Feb. 27, 2018, provisional application No. 62/547,550, filed on Aug. 18, 2017.

(51) Int. Cl.
*G03B 27/54* (2006.01)
*G03F 7/20* (2006.01)

(52) U.S. Cl.
CPC ...... *G03F 7/70083* (2013.01); *G03F 7/70141* (2013.01); *G03F 7/70616* (2013.01); *G03F 7/70916* (2013.01)

(58) Field of Classification Search
CPC ............ G03F 7/70083; G03F 7/70141; G03F 7/70616; G03F 7/70916
See application file for complete search history.

(56) References Cited

U.S. PATENT DOCUMENTS

| 8,542,340 B2 | 9/2013 | Ye et al. | |
|---|---|---|---|
| 2008/0212059 A1* | 9/2008 | Warm | G03F 7/70083 355/68 |
| 2012/0229786 A1* | 9/2012 | Engelen | G03F 7/70091 355/67 |
| 2016/0342094 A1* | 11/2016 | Endres | G02B 19/0019 |

* cited by examiner

*Primary Examiner* — Peter B Kim
(74) *Attorney, Agent, or Firm* — Pillsbury Winthrop Shaw Pittman LLP

(57) ABSTRACT

A method of determining compatibility of a patterning device with a lithographic apparatus. The method includes determining an intensity distribution of a conditioned radiation beam across a sensor plane of an illumination system of the lithographic apparatus. The method further includes using the determined intensity distribution to calculate a non-uniformity of intensity caused by contamination and/or degradation of a collector. The method further includes determining the effect of the non-uniformity on a characteristic of an image of the patterned radiation beam. The method further includes determining the compatibility of the patterning device with the lithographic apparatus based on the effect of the non-uniformity on the characteristic.

20 Claims, 8 Drawing Sheets

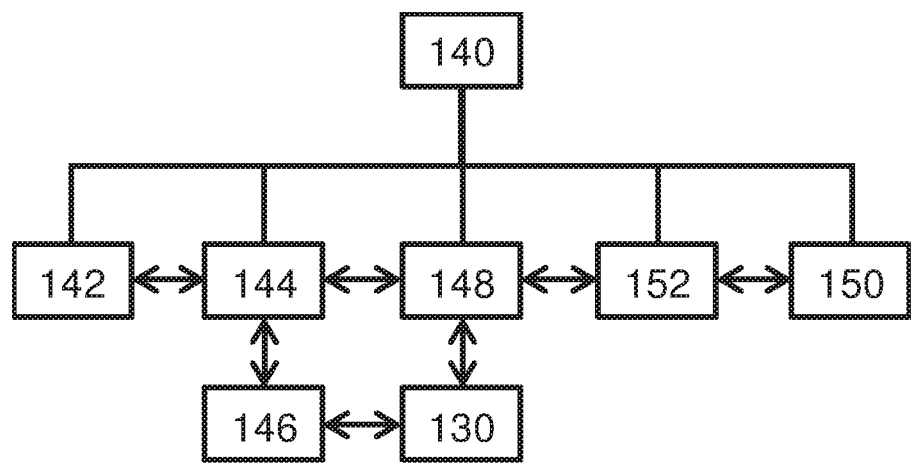
FIG. 5
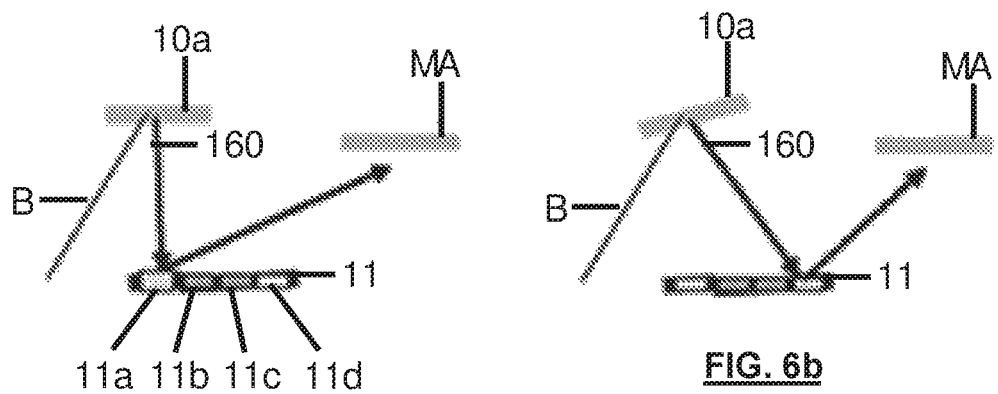
FIG. 6a
FIG. 6b
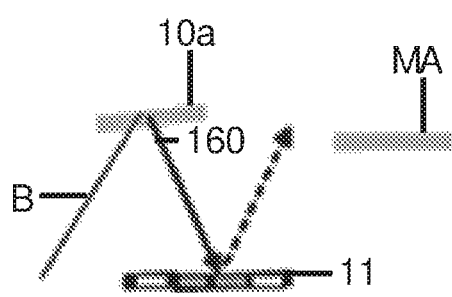
FIG. 6c

LITHOGRAPHIC APPARATUS AND ASSOCIATED METHOD

This application claims priority to U.S. provisional patent application No. 62/547,550, filed Aug. 18, 2017 and to U.S. provisional patent application No. 62/635,976, filed Feb. 27, 2018, each foregoing application is incorporated herein in its entirety by reference.

FIELD

The present disclosure relates to a method and apparatus to determine compatibility of a patterning device with a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask or reticle) onto a layer of radiation-sensitive material (resist) provided on a substrate.

The wavelength of radiation used by a lithographic apparatus to project a pattern onto a substrate typically determines the minimum size of features which can be formed on that substrate. A lithographic apparatus which uses EUV radiation, being electromagnetic radiation having a wavelength within the range of about 4 nm to about 20 nm, may be used to form smaller features on a substrate than a conventional lithographic apparatus (which may, for example, use electromagnetic radiation with a wavelength of 193 nm).

EUV radiation for use by a lithographic apparatus is generated by a source which may for example be a laser produced plasma (LPP) source. A laser, for example a $CO_2$ laser, may be arranged to deposit energy into a fuel, for example tin (Sn), to generate the LPP. Radiation, including EUV radiation for use by the lithographic apparatus, is emitted from the plasma during de-excitation and recombination of ions of the plasma.

SUMMARY

In use, waste products generated by the plasma and/or unused fuel may be deposited on components of the lithographic apparatus and/or source, for example, on a collector to collect radiation emitted by the LPP source. The waste products, unused fuel and/or any other contamination may affect the reflectivity of the collector such that the intensity distribution of the radiation beam changes. The non-uniformity of the intensity distribution of the radiation beam may not be smoothened sufficiently by an illuminator or illumination system within the lithographic apparatus (the illuminator or illumination system is configured to condition the radiation beam before illuminating the patterning device). Changes in the radiation beam intensity distribution may cause a patterning device to be no longer compatible with the lithographic apparatus. In this case, it may be necessary to replace the collector in order to ensure that the patterning device is compatible with the lithographic apparatus. Replacing the collector may be a time consuming task and may be considered to be wasteful and costly.

According to an example of the present disclosure there is provided a method for determining compatibility of a patterning device with a lithographic apparatus. The lithographic apparatus may comprise a collector to collect radiation emitted by a plasma to provide a radiation beam. The lithographic apparatus may comprise an illumination system configured to receive and condition the radiation beam to form a conditioned radiation beam. The lithographic apparatus may comprise a projection system configured to image a patterned radiation beam to an image plane. The patterned radiation beam may be formed by the patterning device configured to impart the conditioned radiation beam with a pattern in its cross-section to form the patterned radiation beam. The method may comprise determining an intensity distribution of the radiation beam. The method may comprise using the determined intensity distribution to calculate a non-uniformity or change of non-uniformity of intensity caused by contamination and/or degradation of the collector. The method may comprise determining the effect of the non-uniformity on a characteristic of the image of the patterned radiation beam. The method may comprise determining the compatibility of the patterning device with the lithographic apparatus based on the effect of the non-uniformity on the characteristic.

The collector (or indeed any other component of the lithographic apparatus) may be affected by contamination (e.g. caused by deposition of material (such as tin or the like) from the plasma) and/or degradation of the collector. The contamination and/or degradation of the collector may result in the intensity distribution of the radiation beam becoming non-uniform (or may cause a change in the non-uniformity). This non-uniformity may affect a characteristic of the image of the patterned radiation beam to such an extent that the patterning device in question may not be compatible with the lithographic apparatus in light of the characteristic. For example, the non-uniformity of the intensity distribution may cause the image formed on the substrate to be such that at least one feature of the image (e.g. part of the pattern) is outside an acceptable tolerance range. For example, the characteristic may cause at least one of the feature(s) of the imaged pattern to have at least one selected from: a critical dimension (CD), critical dimension uniformity (CDU), a horizontal-vertical (HV) bias, a proximity bias average (PBA), a proximity bias range (PBR), or the like, to be outside an acceptable tolerance range for the patterning device in question. The accuracy of the imaging of features from the patterning device on the substrate may affect whether or not it is possible to use the patterning device given the contamination and/or degradation of the collector.

In some situations, it may be necessary to change or service the collector to improve the uniformity of the intensity distribution of the radiation beam to improve the accuracy of the image formation at the substrate. However, such an approach may increase the costs and be considered to be wasteful.

At least one part of any of the methods of the present disclosure may allow a user or manufacturer to predict the imaging performance of the lithographic apparatus for a given level of contamination and/or degradation of the collector. The method may allow the user or manufacturer to match a product (e.g. an integrated circuit or the like) with the lithographic apparatus based on whether the patterning device in question is compatible with the lithographic apparatus for the given (or expected) level of contamination and/or degradation of the collector and/or any other components. This match may reduce the need for collector changes or servicing (increase in availability, decrease in cost of consumable). This matching may be part of a holistic approach where a customer job may be automatically assigned to a lithographic apparatus still able to perform satisfactory imaging given its current or expected collector contamination status.

Additionally or alternatively, degradation and/or contamination of the collector may affect pupil intensity distribution and/or slit uniformity characteristics that result in at least one adverse imaging effect at the substrate. The adverse imaging effect may deteriorate or adversely affect at least one selected from: critical dimension (CD); critical dimension uniformity (CDU); horizontal-vertical (HV) bias; proximity bias average (PBA); proximity bias range (PBR); iso dense bias (IDB), and/or one or more other characteristics associated with the image formed on the substrate.

Methods and apparatus described herein may improve pupil and/or slit uniformity characteristics such that characteristics such as CD, CDU, HV, PBA, PBR, IDB, and/or the like associated with the image formed on the substrate may be less adversely affected by degradation and/or contamination of the collector and/or any other component of a lithographic apparatus. Methods and apparatus described herein may be capable of at least one selected from:

identifying or selecting a compatible combination of a lithographic apparatus and patterning device based on a pupil intensity distribution and/or slit uniformity;

calculating or implementing a pupil correction;

tuning a pupil to a reference pupil according to the contamination and/or degradation of the collector;

calculating the effect of slit uniformity (SU) against exposure latitude;

configuring at least one mirror element of a field facet mirror device to remove a portion of the radiation beam adversely affected by collector contamination and/or degradation;

performing a slit uniformity fine tuning operation; and/or periodically determining at least one pupil parameter. If the at least one pupil parameter exceeds a threshold or is outside a predetermined tolerance range, selecting a different patterning device that is less sensitive to that pupil parameter.

The method may comprise selecting the patterning device based on the effect of the contamination and/or degradation of the collector on the characteristic of the image.

The method may comprise determining whether the characteristic of the image is within an acceptable tolerance range.

The method may comprise identifying a patterning device that is compatible with the lithographic apparatus based on the effect of the non-uniformity on the characteristic.

The method may comprise selecting the patterning device from a database of patterning devices. The selection may be based on identifying a patterning device that is compatible with the lithographic apparatus based on the effect of the non-uniformity on the characteristic of the image. The database may comprise pre-defined combinations of patterning device and pupil shape that are compatible with each other.

The method may comprise determining if a pre-defined combination of patterning device and pupil shape results in compatibility between the patterning device and the lithographic apparatus based on the determined effect of the non-uniformity on the characteristic of the image.

The method may comprise determining the compatibility of at least one patterning device with at least one lithographic apparatus based on the effect of the non-uniformity on the characteristic for each of a plurality of lithographic apparatuses.

The method may comprise identifying an optimum combination of the at least one patterning device and the at least one lithographic apparatus. The method may comprise matching a patterning device with a lithographic apparatus based on which patterning device is compatible with the lithographic apparatus.

The method may comprise identifying at least one patterning device that is compatible with at least one lithographic apparatus. The method may comprise identifying at least one other patterning device that is compatible with at least one other lithographic apparatus.

The method may comprise selecting the optimum combination of the at least one patterning device and the at least one lithographic apparatus.

The method may comprise predicting a lifetime of the collector based on the effect of the contamination and/or degradation of the collector on the characteristic of the image.

The method may comprise predicting when the non-uniformity of intensity caused by contamination and/or degradation of the collector is likely to affect the characteristic of the image of the patterning device such that the characteristic of the image falls outside an acceptable tolerance range for the patterning device.

The method may comprise selecting a different patterning device for use before, during or after an incompatible patterning device forms an image that falls outside the acceptable tolerance range.

The method may comprise identifying when the collector needs to be replaced, cleaned or serviced.

The method may comprise predicting at least one selected from:
  a critical dimension (CD);
  critical dimension uniformity (CDU);
  a horizontal-vertical (HV) bias;
  a proximity bias average (PBA);
  a proximity bias range (PBR);
  feature orientation;
  iso/dense bias (IDB); or
  the like,
of at least one feature of the image.

The method may comprise determining a slit uniformity at an exposure slit formed by the radiation beam. The method may comprise calculating an effect of the slit uniformity on the characteristic of the image.

The patterning device may comprise a plurality of patterning device features. The method may comprise determining an effect of at least one of the plurality of patterning device features on the characteristic of the image based on the slit uniformity.

The method may comprise calculating the effect of slit uniformity against exposure latitude. The exposure latitude may be at least partially dependent on at least one of the plurality of patterning device features.

The method may comprise identifying a compatible combination of a patterning device and a lithographic apparatus based on the effect of the slit uniformity on the characteristic of the image.

The method may comprise determining a pupil intensity distribution at a pupil or pupil plane of the lithographic apparatus. The method may comprise calculating an effect of the pupil intensity distribution on the characteristic of the image.

The patterning device may comprise a plurality of patterning device features. The method may comprise determining an effect of at least one of the plurality of patterning device features on the characteristic of the image based on the pupil intensity distribution.

The method may comprise identifying a compatible combination of a patterning device and a lithographic apparatus based on the effect of the pupil intensity distribution on the characteristic of the image.

The method may comprise determining the intensity distribution of the radiation beam across a sensor plane of the illumination system. The sensor plane may be chosen to enable reconstruction of the intensity distribution of the radiation beam at a pupil or pupil plane of the illumination system.

The method may comprise determining the intensity distribution of the radiation beam optically downstream of the collector. The method may comprise determining the intensity distribution of the radiation beam optically upstream of the patterning device. The method may comprise determining the intensity distribution of the radiation beam optically upstream of the illumination system.

The lithographic apparatus may comprise a scrambler configurable to select or change an illumination mode or pupil shape of the radiation beam.

The method may comprise determining the intensity distribution of the radiation beam optically upstream and/or optically downstream of the scrambler.

The scrambler may comprise an array of mirror elements. The method may comprise configuring the array of mirror elements to select or change the illumination mode or pupil shape of the radiation beam.

The method may comprise configuring at least one of the mirror elements to change a pupil intensity distribution.

The method may comprise determining the pupil intensity distribution and using the determined pupil intensity distribution to calculate at least one characteristic of the image.

The method may comprise configuring at least one of the mirror elements to remove a portion of the radiation beam corresponding to a sharp change in reflectivity on the collector so that the portion of the radiation beam does not illuminate the patterning device.

The lithographic apparatus may comprise an array of pupil elements. The scrambler may be configured to reflect the radiation beam towards the array of pupil elements. The method may comprise selecting a configuration of the scrambler to illuminate at least some of the array of pupil elements.

The method may comprise selecting or changing the illumination mode or pupil shape of the radiation beam to at least partially compensate for the effect of the contamination and/or degradation of the collector on the characteristic of the image.

Selecting or changing the illumination mode or pupil shape of the radiation beam may comprise changing an angular intensity distribution of the radiation beam, and optionally may comprise changing the angular intensity distribution at a sensor plane and/or a pupil plane of the illumination system.

Selecting or changing the illumination mode or pupil shape of the radiation beam may comprise changing a spatial intensity distribution of the radiation beam, and optionally may comprise changing the spatial intensity distribution at the image plane and/or a field plane of the illumination system.

The method may comprise determining a propagation path for a plurality of beam portions of the radiation beam propagating via the scrambler. The scrambler may be configurable to change a direction of the propagation path of each of the plurality of beam portions. The scrambler may be configurable to independently change the direction of the propagation path of at least one of the plurality of beam portions.

The method may comprise determining the propagation path of at least one of the plurality of beam portions between the collector and a sensor plane and/or a pupil plane of the illumination system.

The method may comprise using at least one selected from: a backwards ray tracing algorithm to calculate the propagation path of the plurality of beam portions from the sensor plane and/or pupil plane to the collector; and/or a forward ray tracing algorithm to calculate the propagation path of the plurality of beam portions from the collector to the sensor plane and/or pupil plane.

The method may comprise using a known or selected illumination mode or pupil shape of the radiation beam produced by the scrambler to determine the propagation path of the plurality of beam portions, and optionally may comprise determining the propagation path for each of the beam portions between the scrambler and the sensor plane and/or pupil plane. The method may comprise determining a one-to-one optical relation defined by the plurality of beam portions between the scrambler and the sensor plane and/or pupil plane.

The method may comprise using a ray tracing algorithm to trace the propagation path of the plurality of beam portions based on an intensity distribution measured in the sensor plane and/or pupil plane. The method may comprise reconstructing an intensity profile of the radiation beam at a far field plane of the illumination system.

The method may comprise determining the propagation path of the plurality of beam portions between the collector and the image plane and/or a field plane of the illumination system.

The method may comprise using at least one selected from; a backwards ray tracing algorithm to calculate the propagation path of the plurality of beam portions from the image plane and/or the field plane to the collector; and/or a forward ray tracing algorithm to calculate the propagation path of the plurality of beam portions from the collector to the image plane and/or the field plane.

The method may comprise using a known or selected illumination mode or pupil shape of the radiation beam produced by the scrambler to determine the propagation path of the plurality of beam portions. The method may comprise determining the propagation path for each of the beam portions between the scrambler and the image plane and/or the field plane.

The method may comprise using at least one selected from:

a backwards ray tracing algorithm to calculate at least one propagation path of the radiation beam between the image plane, field plane, far-field plane, sensor plane and/or pupil plane, and the collector; and/or a forward ray tracing algorithm to calculate at least one propagation path of the radiation beam between the collector and the image plane, field plane, far-field plane, sensor plane and/or pupil plane. The method may comprise calculating the at least one propagation path between a scrambler of the illumination system and the image plane, field plane, far-field plane, sensor plane and/or pupil plane.

The method may comprise at least one selected from:

using the forward ray tracing algorithm to determine the intensity distribution of the radiation beam in at least one selected from: the image plane and/or a field plane and/or a far-field plane of the radiation beam; and/or using the forward ray tracing algorithm to determine the effect of the non-uniformity on the characteristic of the image of the patterned radiation beam. The method may comprise using the forward ray tracing algorithm to determine the compatibility of the patterning device with the lithographic apparatus based on the effect of the non-uniformity on the characteristic.

The method may comprise determining the intensity distribution at a sensor plane and/or pupil plane of the illumination system. The method may comprise using the backwards ray tracing algorithm to calculate the non-uniformity of intensity caused by contamination and/or degradation of the collector. The method may comprise using a known or selected configuration of a scrambler of the illumination system to determine a plurality of propagation paths of the radiation beam between the sensor plane and/or pupil plane and the collector, via the scrambler.

The method may comprise determining the intensity distribution of the radiation beam and linking the intensity distribution within an angular range thereof with a corresponding spatial position of the collector. The method may comprise determining the intensity distribution of the radiation beam across a sensor plane and/or pupil plane of the illumination system.

The method may comprise using the intensity distribution within the angular range to determine the contamination and/or degradation at a corresponding spatial position of the collector.

The method may comprise determining the contamination and/or degradation at a plurality of spatial positions of the collector.

The method may comprise positioning a sensor to determine the intensity distribution of the radiation beam. The method may comprise using the sensor to determine the intensity distribution.

The method may comprise positioning the sensor at: the sensor plane and/or the pupil plane, image plane, field plane and/or any other plane in the illumination system.

The method may comprise positioning an aperture, for example a pinhole, at the image plane and/or a field plane of the illumination system. The method may comprise using the aperture to sample part of the radiation beam.

The method may comprise exposing a substrate to the patterned radiation beam.

The lithographic apparatus may comprise the patterning device configured to impart the conditioned radiation beam with the pattern in its cross-section to form the patterned radiation beam.

According to an example of the present disclosure there is provided a computer program. The computer program may comprise instructions which, when executed on at least one processor, may cause the at least one processor to control an apparatus to carry out a method according to any aspect or example of the present disclosure.

According to an example of the present disclosure there is provided a carrier containing the computer program of any aspect or example of the present disclosure. The carrier may be an electronic signal, an optical signal, a radio signal, or a non-transitory computer readable storage medium.

According to an example of the present disclosure there is provided a lithographic apparatus. The lithographic apparatus may comprise a collector to collect radiation emitted by a plasma to provide a radiation beam. The lithographic apparatus may comprise an illumination system configured to receive and condition the radiation beam. The lithographic apparatus may comprise a support structure constructed to support a patterning device. The patterning device may be capable of imparting the radiation beam with a pattern in its cross-section to form a patterned radiation beam. The lithographic apparatus may comprise a substrate table constructed to hold a substrate. The lithographic apparatus may comprise a projection system imaging the patterned radiation to an image plane. The lithographic apparatus may comprise a sensor configured to determine an intensity distribution of the radiation beam. The lithographic apparatus may comprise a processor. The processor may be configured to use the determined intensity distribution to calculate a non-uniformity or change of non-uniformity of intensity caused by contamination and/or degradation of the collector. The processor may be configured to determine the effect of the non-uniformity on a characteristic of the image of the patterned radiation beam. The processor may be configured to determine the compatibility of the patterning device with the lithographic apparatus based on the effect of the non-uniformity on the characteristic.

The illumination system may comprise a scrambler configurable to select or change an illumination mode or pupil shape of the radiation beam.

According to an example of the present disclosure there is provided a method of compensating contamination and/or degradation of an optical element of a lithographic apparatus, wherein the lithographic apparatus comprises: a collector to collect radiation emitted by a plasma to provide a radiation beam, an illumination system configured to receive and condition the radiation beam to form a conditioned radiation beam, the illumination system comprising a scrambler configurable to select or change an illumination mode or pupil shape of the radiation beam, wherein the scrambler comprises an array of mirror elements, and a projection system configured to image a patterned radiation beam to an image plane, wherein the patterned radiation beam is formed by the patterning device configured to impart the conditioned radiation beam with a pattern in its cross-section to form the patterned radiation beam, the method comprising: determining an intensity distribution of the radiation beam; using the determined intensity distribution to calculate a non-uniformity, or change of non-uniformity, of intensity caused by contamination and/or degradation of the collector; and configuring at least one of the mirror elements to reduce the non-uniformity of intensity.

At least one feature of any example, aspect or embodiment of the present disclosure may replace any corresponding feature of any example, aspect or embodiment of the present disclosure. At least one feature of any example, aspect or embodiment of the present disclosure may be combined with any other example, aspect or embodiment of the present disclosure.

BRIEF DESCRIPTION OF THE DRAWINGS

Examples of the present disclosure will now be described, by way of example only, with reference to the accompanying schematic drawings, in which:

FIG. 5 is a schematic view of a method according to an example of the present disclosure;

FIG. 6a, FIG. 6b and FIG. 6c are schematic views of part of the lithographic system of FIG. 2;

DETAILED DESCRIPTION

Figure 1:
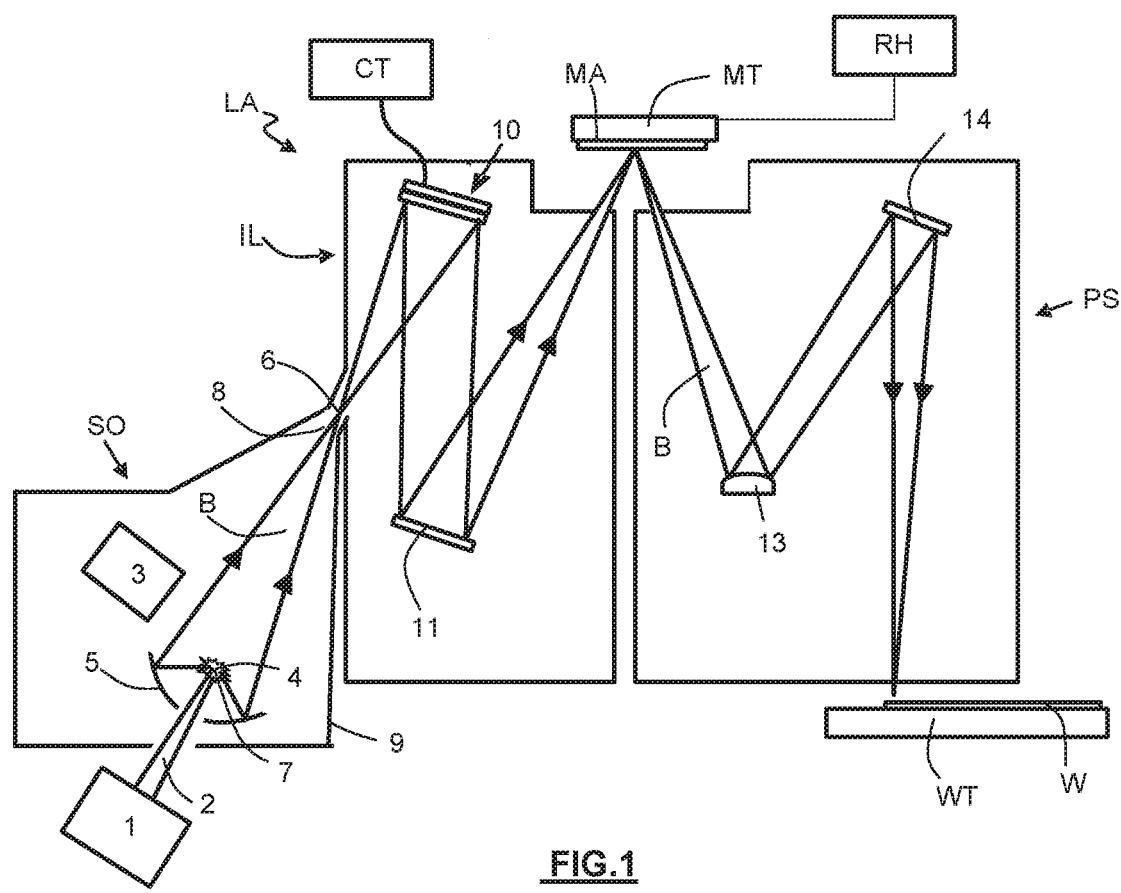
FIG. 1 schematically depicts a lithographic system comprising a radiation source and a lithographic apparatus.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system PS is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below. It will however be appreciated that in another example, the collector 5 could be configured to provide a near grazing-incidence relation with the plasma 7, or indeed any other appropriate configuration.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL includes a scrambler configured to deliver a uniform illumination of the patterning device. The scrambler comprises a field facet mirror (FFM) device 10 and includes a pupil facet mirror (PFM) device 11. The FFM device 10 includes a mirror array made up of individually controllable mirrors/mirror elements. A controller CT controls the orientations of the mirrors of the mirror array (as is described further below). The FFM device 10 and PFM device 11 together provide the radiation beam B with a desired cross-sectional shape and a desired angular intensity distribution. The radiation beam B passes through the illumination system IL and is incident upon the patterning device MA held by the support structure MT. A handler RH for handling the patterning device MA is provided to allow the patterning device MA to be changed as required. The patterning device MA reflects and patterns the radiation beam B. The illumination system IL may include other mirrors or devices in addition to or instead of the FFM device 10 and PFM device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
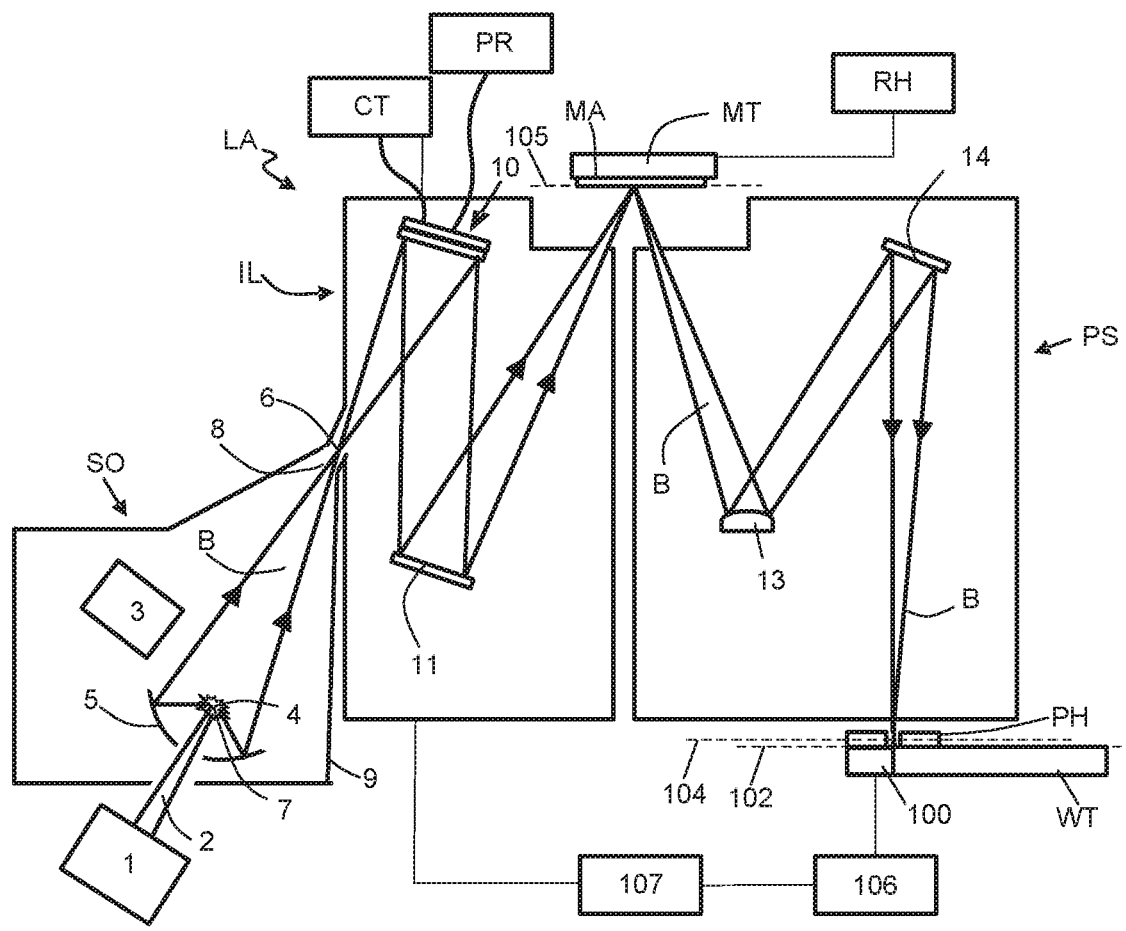
FIG. 2 is a schematic view of the lithographic system further including a sensor according to an example of the present disclosure.

Referring next to FIG. 2, which shows the lithographic system of FIG. 1 without the substrate W in place (although it will be appreciated that the substrate W may be in place on the table WT, for example as shown in FIG. 1), a sensor 100 is provided (e.g. supported by the table WT) to measure an intensity distribution of the radiation beam B below aperture (e.g., pinhole) PH to analyze a portion of the beam B. In this example, the aperture PH is supported by the table WT defining a substrate level and the sensor 100 is positionable to allow the sensor 100 to measure an intensity distribution of the conditioned radiation beam B across a sensor plane 102, wherein the sensor plane 102 is chosen to enable reconstruction of the intensity distribution of the radiation beam B at a pupil plane of the illumination system IL. The sensor 100 can be moved (e.g. by the table WT) to receive the radiation beam B as required. For example, during a measurement the sensor 100 may be moved into the path of the radiation beam B; while during exposure of the substrate W, the sensor 100 may be moved so that the substrate W is in the path of the radiation beam B. The aperture PH is located at an image plane 104 defined by the image formed at the substrate level by the patterning device MA (which itself is at a field plane 105 of the illumination system IL). Using the aperture PH at the image plane 104 results in an intensity distribution at the sensor plane 102 representing the pupil distribution at the image plane 104. It will be appreciated that the patterning device MA may include reflective and/or non-reflective elements to impart the pattern on the radiation beam B. It will be appreciated that the aperture PH may be located at the substrate level and/or at the patterning device MA location (e.g. which may define a field plane of the illumination system IL). It will be appreciated that the distance between the sensor plane 102 and the image plane 104 is not to scale and may vary depending on the focusing properties of the radiation beam B. In an example, the sensor plane 102 and the image plane 104 may correspond to the same plane, or at least substantially the same plane. The sensor 100 (and aperture PH) need not be part of table WT; for example, it could be part of another table, located at the end of an arm, positioned manually, etc.

An end user of the lithographic apparatus LA may have a list (e.g. a table, database, or the like) containing pre-defined combinations of patterning devices MA and pupil shapes (e.g. which may correspond to an illumination mode defined by the FFM device 10 and the PFM device 11) that are compatible with each other. The sensor 100 is connected to a processor 106 to determining the intensity distribution of the conditioned radiation beam B across the sensor plane 102 of the illumination system IL. The processor 106 is configured to use the determined intensity distribution to calculate a non-uniformity of intensity (or a change thereof) caused by contamination and/or degradation of the collector 5, and determine the effect of the non-uniformity or change on a characteristic of the image of the patterned radiation beam B. The processor 106 is further configured to determine the compatibility of the patterning device MA with the lithographic apparatus LA based on the effect of the non-uniformity on the characteristic.

In an example, the processor 106 may be configured to determine if a pre-defined combination of patterning device MA and pupil shape, in combination with the determined intensity distribution (or beam profile) of the radiation beam B will result in compatibility between the lithographic apparatus LA and the patterning device MA (e.g. in view of the effect of the non-uniformity on the characteristic of the image). The intensity distribution of the radiation beam B at locations optically upstream and downstream of the FFM device 10 may be determined by appropriate calculations (e.g. based on the known configuration of the FFM device 10).

In an example, the processor 106 may be configured to calculate an effect of slit uniformity at an exposure slit formed by the radiation beam on the characteristic of the image. The slit uniformity may refer to a measure of the uniformity of intensity distribution at the exposure slit. In this example, the exposure slit is formed by the FFM device 10 such that the patterning device MA is illuminated by the radiation beam B in the form of a slit at the field plane. In other words, the FFM device 10 and the associated optics of the illumination system IL shapes the radiation beam B such that a band of radiation or a substantially rectangular radiation beam profile is formed at the patterning device MA. The part of the patterning device MA illuminated by the exposure slit is then imaged onto the substrate W by the projection system PS. Alternatively or additionally, the lithographic apparatus LA may comprise an aperture configured to form the exposure slit in the radiation beam B. Calculating the effect of slit uniformity at the exposure slit on a characteristic of the image will herein be referred to as a slit uniformity determination operation.

In general, the patterning device MA comprises a plurality of patterning device features. The processor 106 may be configured to determine, based on the slit uniformity, an effect of at least one of the plurality of patterning device features on a characteristic of the image. The processor 106 may be configured to identify at least one type of patterning device feature that is not substantially affected by at least one characteristic of the image. For example, the characteristic of the image may comprise at least one selected from: CD, CDU, HV bias, PBA, PBR, IDB, and/or any other characteristic associated with the image. The processor 106 may be configured to identify one or more of a plurality of patterning devices MA comprising the at least one type of patterning device feature that is compatible with the lithographic apparatus LA. For example, the lithographic apparatus LA may have a non-uniform slit. However, the slit uniformity may be such that the lithographic apparatus LA is still compatible with one or more certain patterning devices MA.

In an example, if the feature type is configured to form only horizontal structures or only vertical structures, such structures may not be substantially affected by horizontal-vertical bias. Horizontal-vertical bias causes a difference in linewidth between closely-spaced horizontal structures and vertical structures formed using the lithographic apparatus. Horizontal-vertical bias may not have an adverse effect on the formation of only vertical or only horizontal structures on the substrate W. Therefore, a patterning device MA may be regarded as compatible with a lithographic apparatus LA suffering from HV bias if essentially only closely-spaced horizontal structures or essentially only closely-spaced vertical structures are formed. The processor 106 may therefore be configured to identify a compatible combination of lithographic apparatus LA and patterning device MA if the patterning device MA is configured to form essentially only closely-spaced horizontal structures or essentially only closed-spaced vertical structures. It will be appreciated that other characteristics of the image may not have a substantially adverse effect on the structures. In general, the processor 106 may be configured to identify one or more patterning devices MA that form structures that are not substantially affected by a particular slit non-uniformity. In this example, the processor 106 is configured to identify a compatible combination of patterning device MA and lithographic apparatus LA based on the effect of the slit non-uniformity on the characteristic of the image. This will herein be referred to as a slit uniformity optimization operation.

The processor 106 may be configured to calculate the effect of slit non-uniformity (SU) against exposure latitude. This may be in addition to or part of the slit uniformity determination operation or slit uniformity optimization operation. The SU describes intensity variations throughout the image plane of the illumination system IL. The resulting image of the patterning device MA (e.g. in terms of the local linewidth and/or CD) can be sensitive to such intensity variations. The extent to which the intensity (or dose) of radiation can vary while still achieving an acceptable pattern in resist on the substrate W is known as "exposure latitude". The exposure latitude is at least partially dependent on the patterning device features present on the patterning device MA. The knowledge that the image of a patterning device MA is sensitive to SU intensity variations may be used to determine the compatibility of the patterning device MA with a certain lithographic apparatus LA. In general, the SU may be measured ahead of almost every substrate W being processed. There may therefore be plenty of data available to determine the compatibility of patterning device MA and lithographic apparatus LA combinations purely based on or partly based on the SU and the known sensitivity of resist on the substrate W to dose variations (e.g., exposure latitude).

In an example, the processor 106 may be operable to configure at least one mirror element of the FFM device 10 to remove a portion of the radiation beam B corresponding to a sharp change in reflectivity on the collector 5 so that the portion of the radiation beam B does not illuminate the patterning device MA. Sharp changes in reflectivity on the collector 5 result in a corresponding non-uniform SU. The removal of the effect of the sharp change will herein be referred to as a slit uniformity fine tuning operation.

Slit uniformity is sensitive to features on the collector 5 that result in corresponding transitions of radiation being visible at the level of the patterning device MA. For example, tin droplets on the collector 5 can cause a corresponding reduction in reflectivity of the collector 5. Such a reduction in reflectivity on the collector 5 at the tin droplets or other contamination/degradation results in dampened or dark regions that may contribute to the non-uniformity of the SU. In an example, a uniformity correction module (sometimes referred to as a UNICOM component) is provided in conjunction with or as part of the illumination system IL. However, the uniformity correction module may not have sufficiently small resolution to be able to remove sharp features or transitions from the radiation which is incident upon the patterning device MA. A change of reflectivity of the collector which causes a feature or transition of the radiation that cannot be corrected using the uniformity correction module may be referred to as a sharp change of reflectivity. A tin droplet on the collector may, for example, cause a sharp change of reflectivity of the collector.

In an example, at least one of the mirror elements of the FFM device 10 may be configured (e.g. reoriented or moved) in order to remove an effect of a sharp feature on the collector 5 that is not otherwise corrected for by the uniformity correction module. For example, radiation corresponding to the dampened or dark region on the collector 5 may be incident on at least one of the mirror elements of the FFM device 10. Those one or more mirror elements may be configured so that the radiation from the dampened or dark region no longer contributes to the exposure slit. Hence, the dampened or dark region will no longer illuminate the patterning device MA, nor adversely affect the imaging characteristics.

As described herein, FIGS. 6a to 6c illustrate examples of a mirror element of a FFM device 10 being configured in order to change the intensity distribution at the patterning device MA. In this example, the mirror element is configured by being reoriented so that a portion of a radiation beam B is directed to a different pupil element of the PFM device 11. Alternatively, as depicted by FIG. 6c, the mirror element can be configured by being reoriented so that the portion of the radiation beam B does not contribute to the illumination of the patterning device MA. This may be referred to as "disabling" a mirror element of the FFM device 10 or "disabling" a pupil element of the PFM device 11. By removing the effect of the sharp change in reflectivity on the collector 5, for example as depicted in FIG. 6c, the slit uniformity may be improved. A pupil correction, as described herein, may be used to compensate for any non-uniformity of the SU. Care may be required to mitigate the effect of loss of intensity at the patterning device MA. For example, the pupil correction and/or slit uniformity fine tuning operation may reduce the intensity at the patterning device. The loss of intensity may be such that action is desirable to help ensure that the resist is exposed sufficiently. For example, a different combination of patterning device MA and lithographic apparatus LA may need to be selected to ensure compatibility. Alternatively or additionally, a different recipe for exposing the resist may be used.

A sensor (such as the sensor 100) may be configured to determine an intensity distribution at a pupil or pupil plane of the lithographic apparatus LA and calculate an effect of the intensity distribution on the characteristic of the image. This will herein be referred to as a pupil determination operation. The intensity distribution at the pupil or pupil plane will herein be referred to as the "pupil intensity distribution". The processor 106 may be configured to determine an effect of at least one of the plurality of patterning device features on the characteristic of the image based on the pupil intensity distribution. The processor 106 may be configured to identify a compatible combination of patterning device MA and lithographic apparatus LA based on the effect of the pupil intensity distribution on the characteristic of the image. This will herein be referred to as a pupil optimization operation.

The slit uniformity and/or pupil intensity distribution may provide a relatively quick indication of the compatibility between a patterning device MA and a lithographic apparatus LA. Analyzing the slit uniformity and/or pupil intensity distribution may reduce the need to perform computationally intensive calculations. For example, analyzing the slit uniformity and/or pupil intensity distribution may reduce the need for a complete scrambler-imaging-analysis (e.g. ray tracing, or the like). Therefore, due to the reduced computation time involved, a compatible lithographic apparatus LA and patterning device MA can be identified relatively quickly. The features on one or more certain patterning devices MA may be sensitive to only certain pupil parameters while being insensitive to others. Therefore, the processor 106 may be configured to identify whether the lithographic apparatus LA has a pupil uniformity and/or slit uniformity that does not substantially affect the imaging of a patterning device MA on the substrate W. For example, certain types of patterning device features may not be substantially adversely affected by a given pupil intensity distribution and/or slit uniformity. Any adverse effect of the contamination and/or degradation of the collector 5 may be minimized by selecting a compatible lithographic apparatus LA and patterning device MA identified using analysis of pupil intensity distribution and/or slit uniformity.

In an example, the processor 106 may be configured to calculate or implement a pupil correction. This will herein be referred to as a pupil correction operation. The processor 106 may be configured to control the FFM device 10 in order to configure at least one of the mirror elements of the FFM device 10. Configuring at least one of the mirror elements may change the pupil intensity distribution. The processor 106 may be configured to determine the pupil intensity distribution and use the determined pupil intensity distribution to calculate at least one characteristic of the image. Appropriately configuring the FFM device 10 may produce a corrected pupil that is compatible with a particular patterning device MA and lithographic apparatus LA combination. The corrected pupil may be used to calculate at least one characteristic of the image.

Contamination and/or degradation of the collector 5 changes a pupil intensity distribution such that a non-ideal pupil may be formed. A non-ideal pupil may adversely affect at least one characteristic of the image of the patterned radiation beam B formed on the substrate W. For example, at least one selected from CD, CDU, HV bias, PBA, PBR, IDB, and/or one or more other characteristics associated with the image of the patterned radiation beam B may be adversely affected by a non-ideal pupil. In order to correct for the adverse effects of a non-ideal pupil, the pupil correction operation may be carried out to obtain an ideal, desired or optimum pupil. For example, the FFM device 10 may be configured to select an illumination mode or pupil shape of the radiation beam. Selecting an appropriate illumination mode or pupil shape may at least partially compensate for the effect of the contamination and/or degradation of the collector 5 on the characteristic of the image. In general, an ideal pupil shape may have a homogeneous intensity distribution throughout the pupil that minimizes the adverse effect of the at least one characteristic on the image formed on the substrate W. As an example situation, the contamination and/or degradation of the collector 5 may be such that there is a "pole unbalance" in the pupil. The pole unbalance may be such that there is a higher intensity of radiation on a first side of the pupil compared to a second side of the pupil. In an example, this non-uniformity of intensity can be compensated for by redirecting radiation reflected by at least one of the mirror elements of the FFM device 10 from the first side to the second side of the pupil.

Different illumination systems IL may have different capabilities in terms of the ability to configure the mirror elements of the FFM device 10. In an example, mirror elements of the FFM device 10 can be orientable between only two different positions, e.g. to illuminate two different pupil elements of the PFM device 11. In another example, there may be relatively more flexibility in reorienting the mirror elements of the FFM device 10. For example, the mirror elements may be reoriented in more than two positions. This may allow more flexibility in, e.g., improving homogeneity of an illumination mode using the mirror elements.

It is proposed to measure an intensity distribution of the beam, provided by the illumination system, and subsequently determine a non-uniformity associated with the measured intensity distribution. Typically this non-uniformity is associated with contamination and/or degradation of the collector of the lithographic apparatus. This non-uniformity may be observed in a slit uniformity profile (e.g. a field plane of the illumination system) or in a pupil intensity distribution (for example pole unbalance). Based on the determined non-uniformity, one or more mirror elements may be adjusted/configured to provide effective compensation of the contamination and/or degradation of an optical element, such as the collector of the lithographic apparatus (but in principle also contamination/degradation of one or more other optical elements located between the patterning device and the plasma or collector may be compensated).

In an embodiment a method of compensating contamination and/or degradation of an optical element of a lithographic apparatus is proposed, wherein the lithographic apparatus comprises: a collector to collect radiation emitted by a plasma to provide a radiation beam, an illumination system configured to receive and condition the radiation beam to form a conditioned radiation beam comprising a scrambler configurable to select or change an illumination mode or pupil shape of the radiation beam, wherein the scrambler comprises an array of mirror elements, and a projection system configured to image a patterned radiation beam to an image plane, wherein the patterned radiation beam is formed by the patterning device configured to impart the conditioned radiation beam with a pattern in its cross-section to form the patterned radiation beam, the method comprising: determining an intensity distribution of the radiation beam; using the determined intensity distribution to calculate a non-uniformity, or change of non-uniformity, of intensity caused by contamination and/or degradation of the collector; and configuring at least one of the mirror elements to reduce the non-uniformity of intensity.

The mirror elements may be configured to change a pupil intensity distribution, change an illumination mode or change a slit uniformity profile. Further, the mirror elements may be configured to remove a portion of the radiation beam corresponding to a sharp change in reflectivity on the collector so that the portion of the radiation beam does not illuminate the patterning device.

As an optional step, a pupil that is closer to the ideal, desired or optimum pupil can be used to calculate or predict at least one characteristic of the image formed on the substrate using any method described herein. For example, a manufacturer or user of the lithographic apparatus LA may have knowledge of the optical components (e.g. focal lengths, optical path lengths, wavelengths, etc.) of the lithographic apparatus LA. This knowledge may be used to determine the intensity distribution at any particular location of the lithographic apparatus LA, for example, using a ray tracing algorithm. The information may be used to calculate or predict at least one characteristic of the image formed on the substrate W. Therefore, this information may be used to help determine the compatibility between a patterning device MA and a lithographic apparatus LA. Information obtained by determining the pupil intensity distribution and/or slit uniformity may be used to determine this compatibility.

In an example, the processor 106 may be configured to communicate with a control system 107 to control the lithographic apparatus LA. The control system 107 may be configured to manage at least part of the lithographic process or control at least part of the lithographic apparatus LA. For example, the control system 107 may be configured to control the FFM device 10, for example, based on an end user's requirements. In an example, the processor 106 may optionally be directly connected to the controller CT to directly control the orientations of the mirrors of the FFM device 10. If required, the processor 106 may be configured to send a signal to the controller CT, for example via the control system 107, to move at least one of the mirrors to change at least one propagation path of a portion of the radiation beam B. Changing the at least one propagation path may change the intensity distribution of the radiation beam B, for example, to change or optimize a pupil shape for the lithographic apparatus LA. At least one method disclosed herein may be used to control the orientation of one or more of the mirrors of the FFM device 10, for example, via the controller CT, which itself may be operable to receive and/or implement computer program instructions. An example method of optimizing the pupil shape is described in U.S. Pat. No. 8,542,340, the contents of which is hereby incorporated by reference in its entirety.

In use, the collector 5 (or indeed any other component of the lithographic apparatus LA) may be affected by contamination (e.g. caused by deposition of material (such as tin or the like) from the plasma 7) and/or degradation of the collector 5. The contamination and/degradation of the collector 5 may result in the intensity distribution of the radiation beam B becoming non-uniform. This non-uniformity may affect a characteristic of the image of the patterned radiation beam B to such an extent that the patterning device MA in question may not be compatible with the lithographic apparatus LA in light of the characteristic. For example, the non-uniformity of the intensity distribution may cause the image formed on the substrate W (see FIG. 1) to be such that at least one feature of the image (e.g. part of the pattern) is outside an acceptable tolerance range. For example, the characteristic may cause at least one of the feature(s) of the imaged pattern to include at least one selected from: a critical dimension (CD), critical dimension uniformity (CDU), a horizontal-vertical (HV) bias, a proximity bias average (PBA), a proximity bias range (PBR), feature orientation, iso/dense bias (IDB), or the like, to be outside an acceptable tolerance range for the patterning device MA in question. The accurate imaging of features from the patterning device MA on the substrate W may affect whether or not it is possible to use the patterning device MA given the contamination and/or degradation of the collector 5. In some situations, it may be necessary to change or service the collector 5 to improve the uniformity of the intensity distribution of the radiation beam B to improve the accuracy of the image formation at the substrate W. However, such an approach may increase the costs and be considered to be wasteful.

Figure 3:
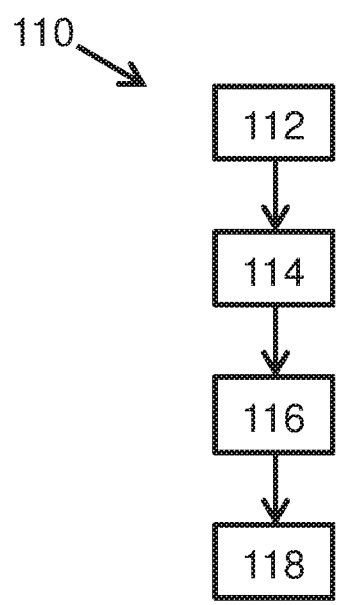
FIG. 3 is a schematic view of a method of determining compatibility of a patterning device with the lithographic apparatus of FIG. 3 according to an example of the present disclosure.

FIG. 3 depicts a schematic of a method 110 of determining compatibility of the patterning device MA with the lithographic apparatus LA. The method 110 includes a step 112 of determining an intensity distribution of the conditioned radiation beam B across the sensor plane 102 of the illumination system IL. The method 110 further includes a step 114 of using the determined intensity distribution to calculate a non-uniformity of intensity caused by contamination and/or degradation of the collector 5. The method further includes a step 116 of determining the effect of the non-uniformity on a characteristic of the image of the patterned radiation beam B. The method 110 further includes a step 118 of determining the compatibility of the patterning device MA with the lithographic apparatus LA based on the effect of the non-uniformity on the characteristic. The method 110 may be implemented by a computer program comprising instructions which, when executed on at least one processor (e.g. the processor 106 of FIG. 2), cause the at least one processor to control an apparatus (e.g. the controller CT) to carry out at least one step of the method 110. The method 110 may provide a passive way to find a compatible combination of a patterning device MA and lithographic apparatus LA.

Figure 4:
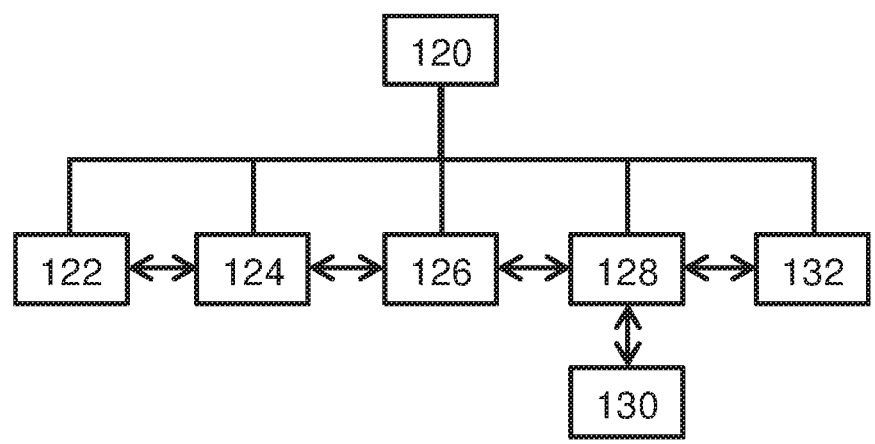
FIG. 4 is a schematic view of a method according to an example of the present disclosure.
Figure 7A:
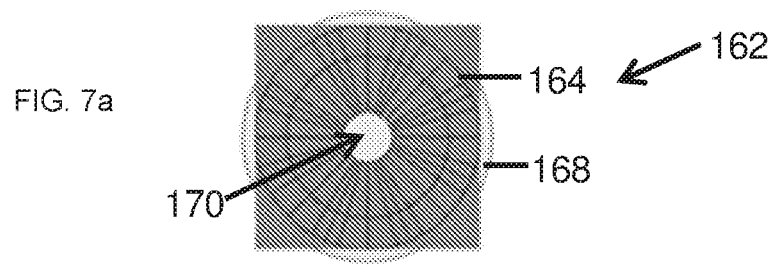
FIG. 7a, FIG. 7b, FIG. 7c, FIG. 7d and FIG. 7e are schematic views of different illumination modes of the lithographic system of FIG. 2.
Figure 7B:
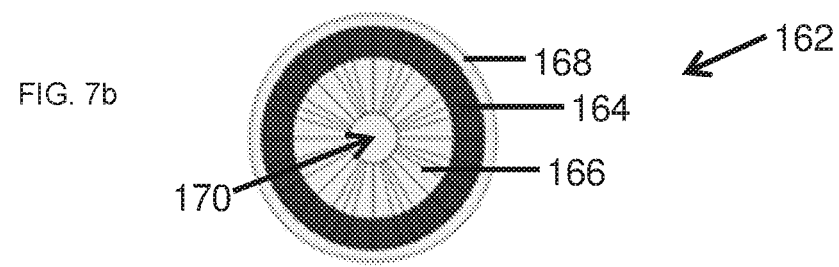
Figure 7C:
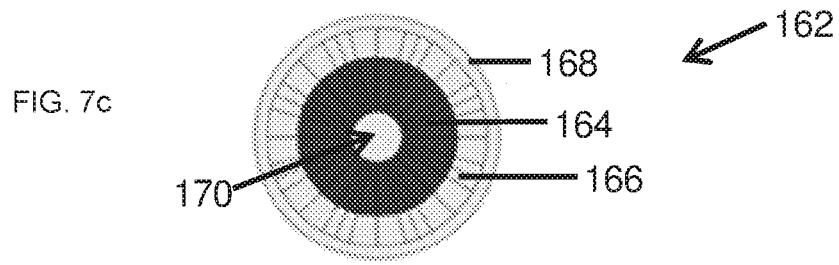
Figure 7D:
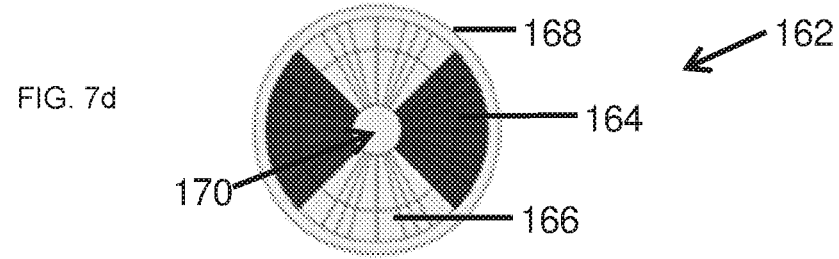
Figure 7E:
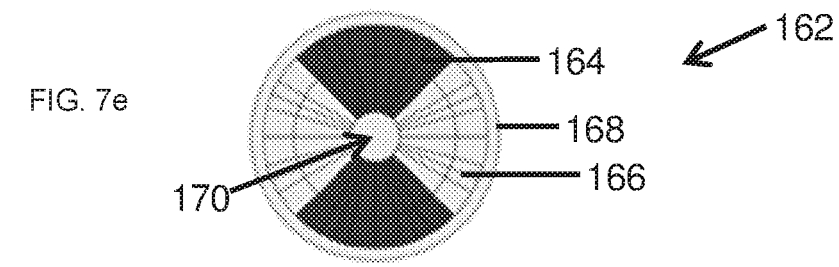

FIG. 4 depicts a schematic of a method 120 that may be carried out in addition to, or as part of, the method 110 of FIG. 3. The method 120 includes a step 122 of selecting the patterning device MA based on the effect of the contamination and/or degradation of the collector 5 on the characteristic of the image. The method 120 may include a step 124 of determining whether the characteristic of the image is within an acceptable tolerance range. For example, an IC manufacturer may have information regarding the acceptable tolerance range for a given patterning device, which may be used in the manufacture of a certain product. The method 120 may allow the manufacturer to determine whether the product can be manufactured within the acceptable tolerance range for the product based on the effect of the contamination and/or degradation on the characteristic of the image. The method 120 may include a step 126 of identifying a patterning device MA that is compatible with the lithographic apparatus LA based on the effect of the non-uniformity on the characteristic. For example, the IC manufacturer may be able to identify a product line that is compatible with a current or expected state (e.g. the current or expected contamination and/or degradation of the collector 5) of the lithographic apparatus LA such that the image of the patterning device MA for exposing the substrate W is within the acceptable tolerance range. The method 120 may include a step 128 of selecting the patterning device from a database 130 of patterning devices MA, wherein the selection is based on identifying a patterning device MA that is compatible with the lithographic apparatus LA based on the effect of the non-uniformity on the characteristic of the image. The method 120 may include a step 132 of using a handler RH or other patterning device MA handling system to move a selected patterning device MA (e.g. from a reticle storage (not shown)) into position on the support structure MT. The step 132 may also include removing a current patterning device MA from the support structure MT and moving another (e.g. a selected) patterning device MA. It will be appreciated that the handler RH may itself be used to provide or define at least part of the support structure MT. Any appropriate patterning device MA handling system may be used to move and/or align the selected patterning device MA as required.

FIG. 5 depicts a schematic of a method 140 that may be carried out in addition to, or as part of, the method 110 of FIG. 3 and/or the method 120 of FIG. 4. The method 140 includes a step 142 of predicting a lifetime of the collector 5 based on the effect of the contamination and/or degradation of the collector 5 on the characteristic of the image. The method 140 may include a step 144 of predicting when the non-uniformity of intensity caused by contamination and/or degradation of the collector 5 is likely to affect the characteristic of the image of the patterning device such that characteristic of the image falls outside an acceptable tolerance range 146 for the patterning device MA. The acceptable tolerance range 146 for a selected patterning device MA may be obtained from the database 130. If the characteristic of the image falls outside the acceptable tolerance range 146, the method 140 may include a step 148 of selecting a different patterning device MA for use before, during or after an incompatible patterning device MA forms an image that falls outside the acceptable tolerance range.

In addition or alternatively, the method 140 may include a step 150 of identifying if or when the collector 5 needs to be replaced, cleaned or serviced. If a manufacturer wishes to manufacture a certain IC device that uses a certain patterning device MA for exposing the substrate W to a certain pattern required for manufacturing the IC device, however if the method 100, 110 or 120 (or any other method) determines that the patterning device MA is incompatible with the lithographic apparatus LA given the current state of the contamination and/or degradation of the collector 5, the manufacturer may decide to replace, clean or service the collector 5.

An alternative or additional approach may be to select a different product line (e.g. for a different IC device) that uses at least one different patterning device MA, which may be deemed to be compatible given the current or expected level of contamination and/or degradation of the collector 5. The method 140 may include a step 152 of predicting at least one selected from:
- a critical dimension (CD);
- critical dimension uniformity (CDU);
- a horizontal-vertical (HV) bias;
- a proximity bias average (PBA);
- a proximity bias range (PBR);
- feature orientation;
- iso/dense bias (IDB); or
- the like, of at least one feature of the image. For example, the step 152 may be used to predict the quality of the image formed on the substrate W. The accuracy of the at least one feature of the image may be subject to an adverse value for at least one selected from: the CD, CDU, HV bias, PBA, PBR, feature orientation, IDB, and/or the like. This adverse value may result in the characteristic of the image falling outside the acceptable tolerance range 146 for the selected patterning device MA.

FIGS. 6a-6c respectively depict different configurations of the scrambler, which in this example is in the form of the field facet mirror (FFM) device 10 depicted by FIGS. 1 and 2. FIGS. 6a-6c also include the PFM device 11 also depicted by FIGS. 1 and 2. The FFM device 10 is configurable to select or change an illumination mode of the radiation beam B by changing the orientation of at least one of the mirrors of the FFM device 10. FIGS. 6a-6c only show one mirror 10a of FFM device 10 for brevity; however it will be appreciated that the FFM device 10 may include plurality of mirrors 10a and each mirror 10a may be independently moveable to change the illumination mode. Each mirror 10a of the FFM device is operable to reflect a beam portion 160 of the radiation beam B, the radiation beam B including a plurality of beam portions 160. Each mirror 10a is independently operable to change the direction of propagation of the beam portion 160 illuminating the mirror 10a, Although FIGS. 6a-6c illustrate just one mirror 10a, it will be appreciated that any number of mirrors 10a may be provided as part of the FFM device 10 (for example 50 or more, 100 or more, 200 or more, 400 or more, 1000 or more mirrors 10a, or the like; however it will be appreciated that the FFM device 10 may include at least 2 mirrors). It will be appreciated that the mirror 10a may be configurable in three different orientations as shown in FIGS. 6a-6c, or may be configurable in any number of different orientations (for example, one, two, four or more orientations, or the like).

FIGS. 6a-6c illustrate 3 three different configurations of the mirror 10a that cause the beam portion 160 to be reflected in different directions to either illuminate one of the pupil mirrors 11a-11d of the PFM device 11 for reflection towards the patterning device MA as depicted in FIG. 6a and FIG. 6b, or to be deflected in a direction such that the radiation beam B is deflected away from the patterning device MA (e.g. to a beam dump, not shown) as depicted by FIG. 6c. Although FIGS. 6a-6c illustrate four pupil mirrors 11a-11d, it will be appreciated that any number of pupil mirrors 11a may be provided as part of the PFM device 11 (for example 50 or more, 100 or more, 200 or more, 400 or more, 800 or more, 1000 or more, 2000 or more pupil mirrors 11a, or the like).

In FIG. 6a, the beam portion 160 reflected by the mirror 10a is directed towards the pupil mirror 11a, which reflects the beam portion 160 towards the patterning device MA. In FIG. 6b, the beam portion 160 reflected by the mirror 10a is directed towards the pupil mirror 11d (along a different propagation path), which reflects the beam portion 160 towards the pattern device MA along a different propagation path to that illustrated by FIG. 6a, In FIG. 6c, the beam portion 160 reflected by the mirror 10a is between the pupil mirrors 6b, 6c, which may or may not result in the beam portion 160 being reflected/absorbed by the PFM device 11 (since the beam portion 160 may not be incident on a reflective surface). Either way, the beam portion 160 in FIG. 11c does not illuminate the patterning device MA.

FIGS. 7a-7e illustrate five examples of possible illumination modes (or pupil shapes) 162 of the radiation beam B. The illumination modes 162 may correspond to a pupil shape of the radiation beam B. The shaded areas 164 of the illumination modes 162 depict a cross-section of the radiation beam B that depicts an angular intensity distribution of the radiation beam B in an image plane for a given illumination mode 162, which may be translated into an intensity distribution of the radiation beam B in a pupil plane. The non-shaded areas 166 of the illumination modes 162 depict non-illuminated areas (e.g. zero or minimal intensity areas) of the overall cross-section 168 of the illumination mode 162. The radial solid lines depicted in FIGS. 7a-7e are reference lines depicting various angular ranges of the illumination modes 162 and do not represent intensity variations of the illumination modes 162. FIGS. 7a-7e respectively show:
- a) a quasi-conventional illumination mode 162 (including a circular dark spot 170 at the center of the cross-section 168, the dark spot 170 corresponding to zero or minimal intensity of the radiation beam B);
- b) an annular (example one) illumination mode 162;
- c) an annular (example two) illumination mode 162 that has a different radius and thickness annulus to that of the example one illumination mode of FIG. 7b;
- d) a dipole example 1 (90 degrees angular range of intensity either side (in the x-direction) of the dark spot 170) illumination mode 162; and
- e) a dipole example 2 (90 degrees angular range of intensity either side (in the y-direction) of the dark spot 170) illumination mode 162.

It will be appreciated that many other examples of illumination modes 162 (e.g. quasar, higher order dipole examples or the like) can be produced by changing the configuration of the FFM device 10. The contamination and/or degradation of the collector 5 may however affect the intensity distribution or evenness of the intensity distribution of the illumination modes 162. Certain illumination modes 162 may be affected by the contamination and/or degradation to a greater extent than other illumination modes 162. It will be appreciated that the illumination mode 162 may take any shape, dimension, mode order, or the like, and may or may not include areas with zero or minimal intensity, depending on the selected illumination mode 162.

Referring again to FIG. 6, by changing the configuration of the FFM device 10, the plurality of the beam portions 160 become scrambled (e.g. in terms of relative angular direction of propagation of the plurality of the beam portions 160) to change the angular intensity distribution of the radiation beam B compared with the radiation B incident on the FFM device 10. Depending on which pupil mirrors 11a are illuminated, as well as the angular intensity distribution of the radiation beam B at the PFM device 11, it may be possible to construct one of the illustrated illuminations modes 162 illustrated by FIG. 7. It may be possible to construct an arbitrary illumination mode 162 based on any possible configuration of the FFM device 10 and the PFM device 11.

Figure 8:
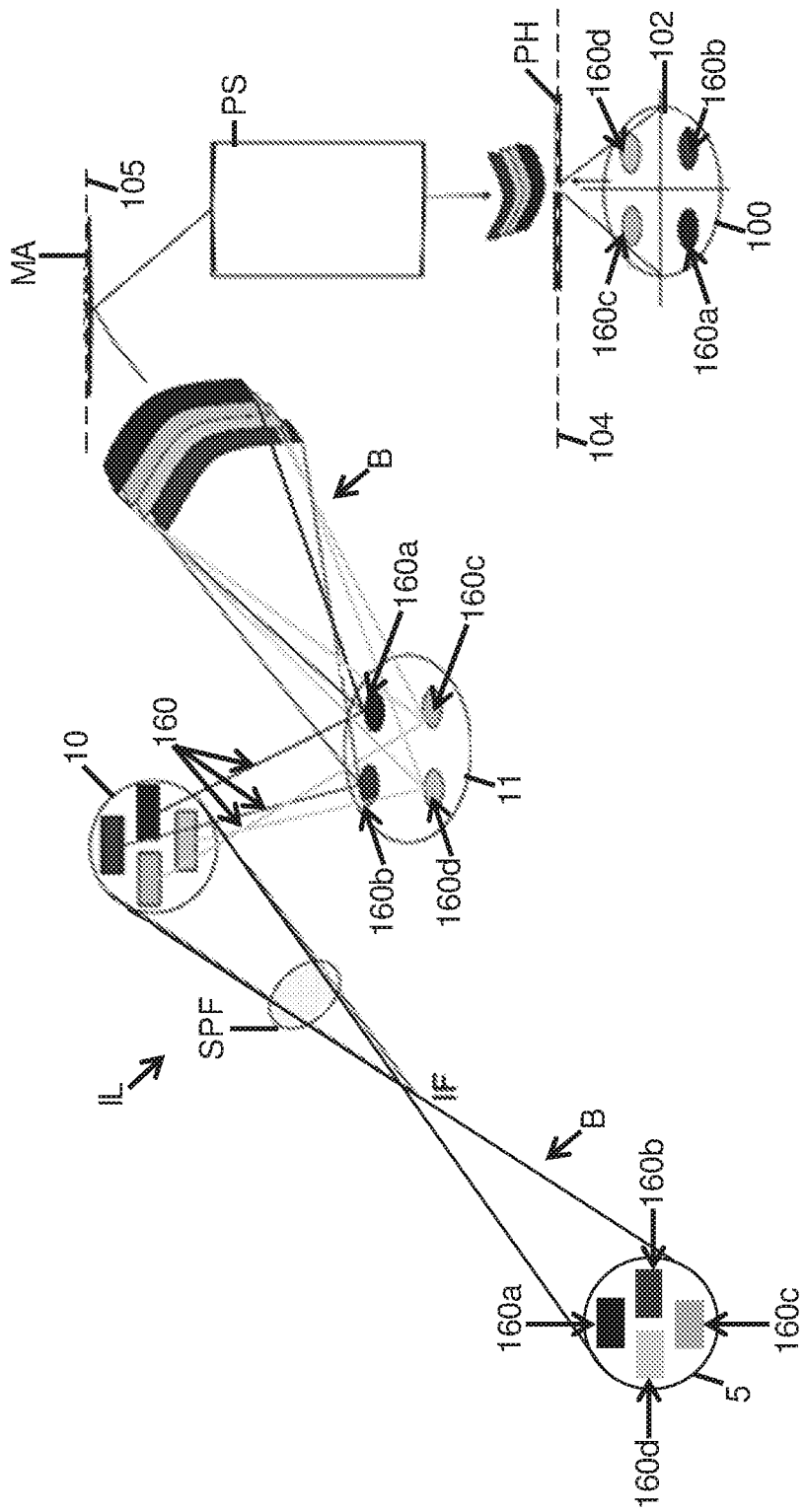
FIG. 8 is a schematic view of the lithographic system of FIG. 2.

FIG. 8 is a schematic illustration of the lithographic apparatus LA of FIG. 2 that depicts four beam portions 160 such as depicted by FIGS. 6a-6c. The reference signs used in FIG. 8 refer to like or similar features as those referred to in FIG. 2 and/or FIGS. 6a-6c. In FIG. 8, the collector 5 includes four areas depicted by arrows 160a-160d. Each area of the collector 5 in this example includes a level of contamination and/or degradation resulting in a difference in the intensity of the radiation reflected by the collector 5 at the position of these four areas. Beam portion 160a has the highest intensity (corresponding to the darkest shaded beam portion 160 in FIG. 8); while beam portions 160b-160d respectively have successively lower intensities (relative to the beam portion 160a). The radiation beam B propagates through the intermediate focus IF, a spectral filter SPF (e.g. for filtering out wavelengths such as infrared, or the like) and is incident on the FFM device 10. The FFM device 10 includes four mirrors (e.g. each corresponding to the mirror 10a in FIGS. 6a-6c), each of which is operable to receive and reflect a beam portion 160 of the radiation beam B towards the PFM device 11, which itself includes four pupil mirrors (e.g. corresponding to pupil mirrors 11a-d in FIGS. 6a-6c). It will be appreciated that the spectral filter SPF may be optional, and if present, can be located at a different position. For example, the spectral filter SPF may alternatively or additionally be incorporated into the collector 5 or another component.

The radiation beam B illuminates the patterning device MA and is projected with the projection system PS through the aperture PH to illuminate the sensor 100 at the sensor plane 102. It will be recognised that each beam portion 160a-d can be traced between the sensor plane 102 and the collector 5 in order to determine the contamination and/or degradation of the collector 5 (e.g. through use of knowledge of the parameters of the optical components of the illumination system and the configuration of the FFM device 10). It will be appreciated that any number of beam portions 160 may be reflected by the FFM device 10 (which itself may have any number of mirrors 10a), and that any number of pupil mirrors 11a-d may be provided. Although the present example depicts four areas/beam portions 160, it will be appreciated that any number of areas/beam portions 160 may be defined in the lithographic apparatus LA. For example, the number of areas may correspond to the number of mirrors 10a in the FFM device 10. In another example, not all mirrors 10a may be utilized and/or some beam portions 160 may be deflected away from the patterning device MA such that not all areas of the collector 5 may contribute to the illumination mode 162.

Figure 9:
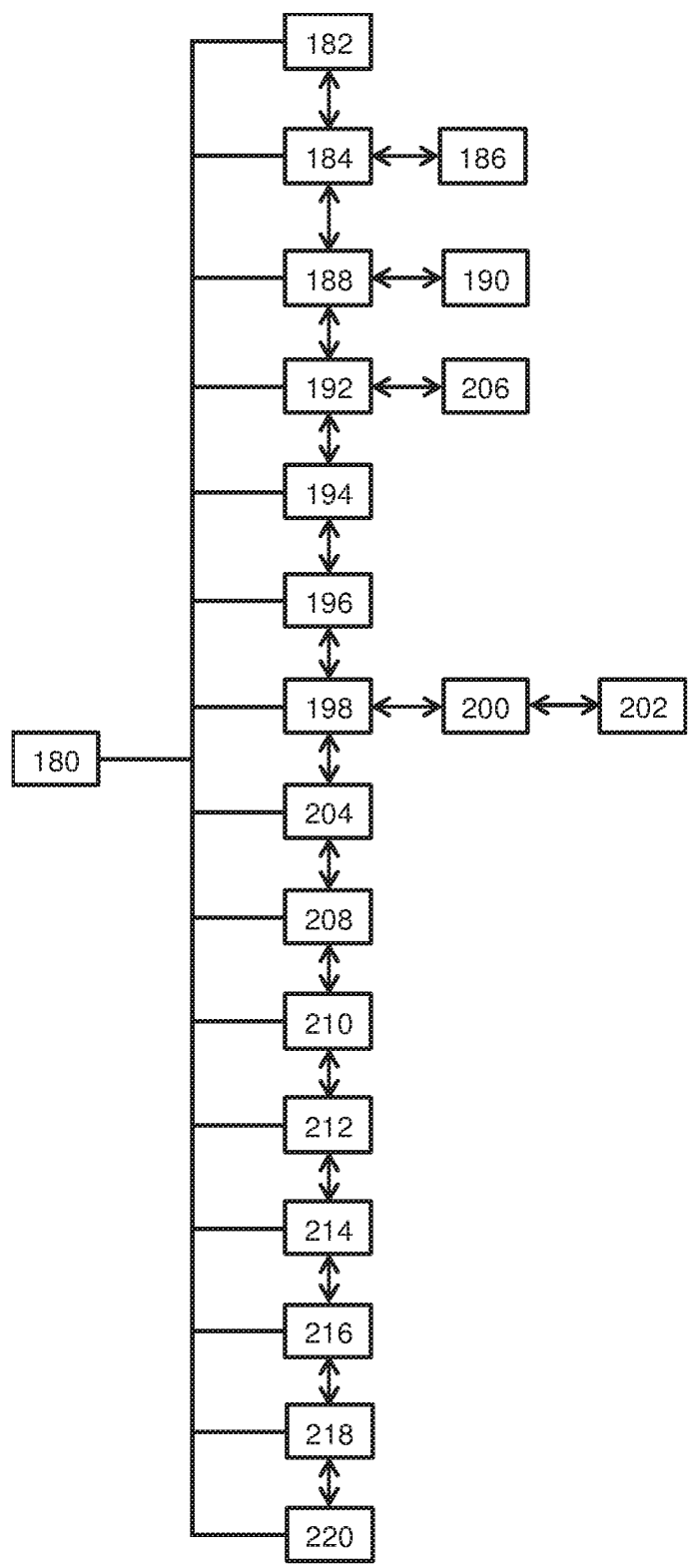
FIG. 9 is a schematic view of a method according to an example of the present disclosure.

FIG. 9 depicts a schematic illustration of a method 180 that may be carried out in addition to, or as part of, the method 110 of FIG. 3, the method 120 of FIG. 4 and/or the method 140 of FIG. 5, or any other method described herein. The method 180 may include a step 182 of selecting or changing the illumination mode 162 of the radiation beam B, for example, to at least partially compensate for the effect of the contamination and/or degradation of the collector 5 on the characteristic of the image. It will be appreciated that the methods 110, 120 and 140 (or any other methods described herein) may be used to passively identify a compatible combination of patterning device MA and lithographic apparatus LA, while the step 182 and other similar steps may not necessarily be used, for example, if the method of any example described herein can identify at least one compatible combination of patterning device MA and lithographic apparatus LA (e.g. without changing the illumination mode 162).

The method 180 may include a step 184 of changing an angular intensity distribution of the radiation beam B. The step 184 may include a step 186 of changing the angular intensity distribution at the sensor plane 102 of the illumination system IL. The method 180 may include a step 188 of changing a spatial intensity distribution of the radiation beam. The step 188 may include a step 190 of changing the spatial intensity distribution at the image plane 104 and/or the field plane 105 of the illumination system IL. The intensity distribution of the radiation beam B may correspond to the illumination mode 162 provided by the FFM device 10 and PFM device 11.

The method 180 may include a step 192 of determining a propagation path for a plurality of beam portions 160 of the radiation beam B propagating via the FFM device 10. The method 180 may include a step 194 of determining the propagation path of at least one of the plurality of beam portions 160 between the collector 5 and the sensor plane 102 of the illumination system IL.

The method 180 may include a step 196 of using a backwards ray tracing algorithm to calculate the propagation path of the plurality of beam portions 160 from the sensor plane 102 to the collector 5.

Alternatively or additionally, the method 180 may include a step 198 of using a forward ray tracing algorithm to calculate the propagation path of the plurality of beam portions 160 from the collector 5 to the sensor plane 102. The step 198 may include a step 200 of using a known or selected illumination mode 162 of the radiation beam B to determine the propagation path of the plurality of beam portions 160. The step 198 may include a step 202 of determining the propagation path for each of the beam portions 160 between the FFM device 10 and the sensor plane 102. The method 180 may be used to determine a one-to-one optical relation defined by the plurality of beam portions 160 between the FFM device 10 and the sensor plane 102. For example, it may be possible to use ray tracing to determine the propagation path of the plurality of beam portions 160 using information regarding the configuration of the FFM device 10 such that it may be possible to trace the propagation path of the plurality of beam portions 160, via the PFM device 11, via the patterning device MA, via the projection system PS, and to the sensor plane 102. The step 198 may include using a known or selected illumination mode 162 of the radiation beam produced by the FFM device 10 to determine the propagation path of the plurality of beam portions 160.

The method 180 may include a step 204 of using a ray tracing algorithm to trace the propagation path of the plurality of beam portions 160 based on an intensity distribution measured in the sensor plane 102, and reconstruct an intensity profile of the radiation beam B at a far field plane (not shown) of the illumination system IL, for example, to determine the intensity distribution of the radiation beam B that may be observed/measured at the image plane 104 of the illumination system IL. Reconstruction of the intensity distribution at the sensor plane 102 and/or image plane 104 may be used to determine the effect of the contamination and/or degradation of the collector 5 on the image formed at the image plane 104. The step 192 of the method 180 may include a step 206 determining the propagation path of the plurality of beam portions 160 between the collector 5 and the image plane 104 and/or the field plane 105 of the illumination system IL. For example, using the intensity distribution measured in the sensor plane 102, it may be possible to determine the propagation path (e.g. using forward ray tracing, or the like) of the plurality of beam portions 160 between the collector 5 and the field plane 105 and/or the image plane 102. Alternatively or additionally, backwards ray tracing may be used to calculate the propagation path of the plurality of beam portions 160 from the image plane 104 and/or the field plane 105 to the collector 5.

Alternatively or additionally, the method 180 may include a step 208 of using a backwards ray tracing algorithm to calculate at least one propagation path of the radiation beam (for example the plurality of propagation paths of the plurality of beam portions 160) between the image plane 104, field plane 105, far-field plane (not shown) and/or sensor plane 102, and the collector 5. Alternatively or additionally, the method 180 may include a step 210 of using a forward ray tracing algorithm to calculate at least one propagation path of the radiation beam B between the collector 5 and the image plane 104, field plane 105, far-field plane (not shown) and/or sensor plane 102. It will be appreciated that the ray tracing algorithm may be used to calculate part of the propagation path of the beam portions, for example, between the FFM device 10 and the image plane 104, field plane 105, far-field plane (not shown) and/or sensor plane 102.

Alternatively or additionally, the ray tracing algorithm may be used to calculate the propagation path of the radiation beam B between the collector 5 and the FFM device 10, for example, the ray tracing algorithm may be used to determine which part of the collector 5 (e.g. an element thereof) corresponds to the beam portion 160 reflected by the FFM device 10. Thus, the ray tracing algorithm may be able to determine which element (see e.g. FIG. 8) of the collector 5 (each element may have a different contamination and/or degradation level depending on position or size of the element on the collector 5) affects each beam portion 160 of the radiation beam B and hence, trace through the illumination system IL how that contamination and/or degradation affects the intensity distribution at a desired plane (e.g. the sensor plane 102 and/or the image plane 104) of the illumination system IL. It will be appreciated that a manufacturer or user of the lithographic apparatus LA may have knowledge of the optical components (e.g. focal lengths, optical path lengths, wavelengths, etc.) of the illumination system IL such that it may be possible to use parameter values corresponding to these known optical components to determine the intensity distribution e.g. using the forward ray tracing algorithm, or the like.

Alternatively or additionally, the method 180 may include a step 212 of using the forward ray tracing algorithm to determine the intensity distribution of the radiation beam in at least one selected from: the image plane 104 and/or a field plane 104 and/or a far-field plane (not shown) of the radiation beam B. The method 180 may include a step 214 of using the forward ray tracing algorithm to determine the effect of the non-uniformity on the characteristic of the image of the patterned radiation beam B, and may include a step 216 of using the forward ray tracing algorithm to determine the compatibility of the patterning device MA with the lithographic apparatus LA based on the effect of the non-uniformity on the characteristic. The method 180 may be used to determine the intensity distribution of the radiation beam B and link the intensity distribution within an angular range of the radiation beam B with a corresponding spatial position of the collector, the method optionally comprising determining the intensity distribution of the radiation beam across a pupil plane of the illumination system. For example, with reference to FIG. 8, it may be possible to use the intensity distribution within the angular range (e.g. of each beam portion 160) to determine the contamination and/or degradation at a corresponding spatial position of the collector 5.

The method 180 may include a step 218 of using the sensor 100 to determine the intensity distribution, for example, at any desired plane of the illumination system IL such as at the sensor plane 102, image plane 104, field plane 105 and/or any other plane in the illumination system.

The method 180 may include a step 220 of exposing the substrate W to the patterned radiation beam B, for example, if the patterning device MA is compatible with the lithographic apparatus LA for a given contamination and/or degradation of the collector 5.

Figure 10:
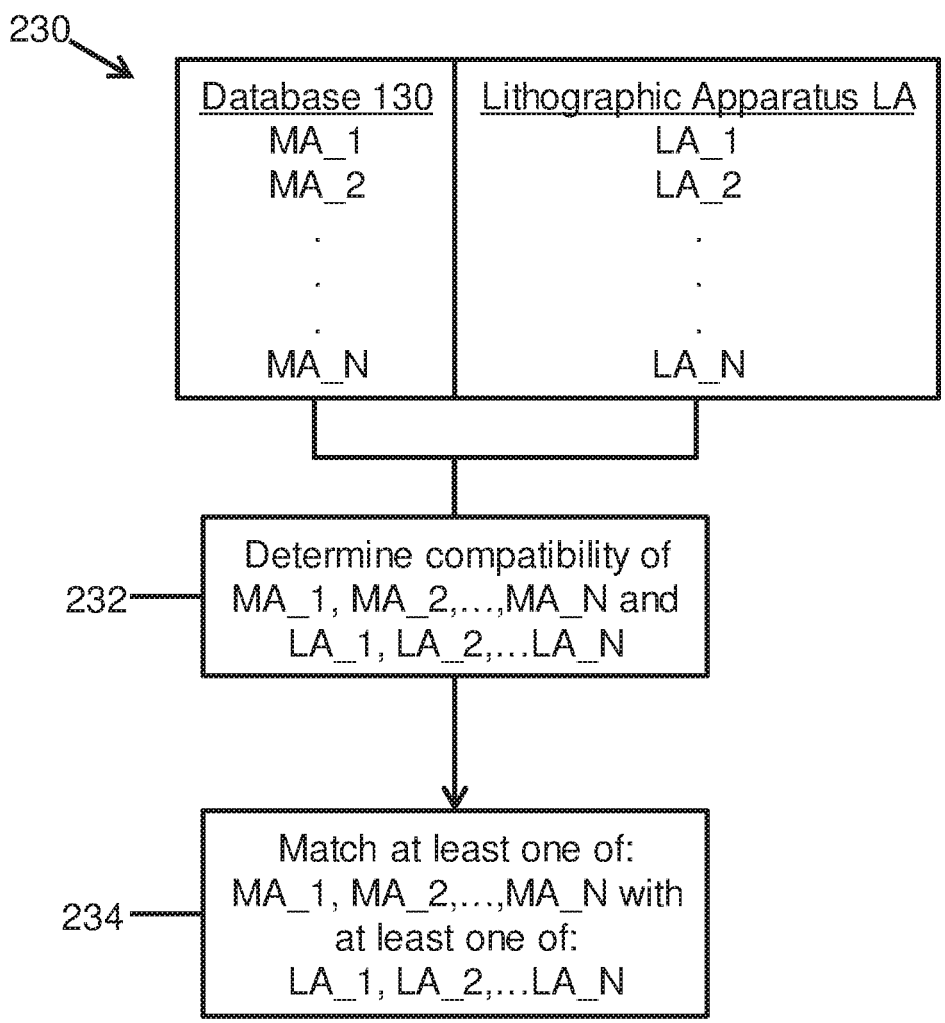
FIG. 10 is a schematic view of a method according to an example of the present disclosure.

FIG. 10 depicts a schematic illustration of a method 230 that may be carried out in addition to, or as part of the method 110 of FIG. 3, the method 120 of FIG. 4, the method 140 of FIG. 5, the method 180 of FIG. 9 and/or any other method described herein. The method 230 includes a step 232 of determining the compatibility of at least one patterning device MA with at least one lithographic apparatus LA based on the effect of the non-uniformity on the characteristic for each of a plurality of lithographic apparatuses LA. For example, a production facility may include a plurality of lithographic apparatus LA_1, LA_2, . . . , LA_N (for N lithographic apparatuses) and an end user or computer program may have the ability to select (actively or passively) which lithographic apparatus LA to use for manufacturing a product. In addition or alternatively, the step 232 may be capable of identifying whether one or more patterning devices MA (details of which may be provided in a database 130 including patterning devices MA_1, MA_2, . . . , MA_N (for N products/patterning devices MA)) is compatible with any of the lithographic apparatuses LA in the manufacturing facility.

The method 230 may include a step 234 of identifying an optimum combination of the at least one patterning device MA and the at least one lithographic apparatus LA, for example, by matching a patterning device MA (or more than one patterning device MA) with a lithographic apparatus LA (or more than one lithographic apparatus LA) based on which patterning device(s) MA is/are compatible with (at least one of) the lithographic apparatus LA.

The method 230 may be used to identify at least one patterning device MA that is compatible with at least one lithographic apparatus LA, and identifying at least one other patterning device MA that is compatible with at least one other lithographic apparatus MA. For example, a customer or manufacturer may have two products that respectively use patterning devices MA_1 and MA_2 and at least two lithographic apparatuses LA_1 and LA_2. The customer or manufacturer may be using the following combination: patterning device MA_1 with lithographic apparatus LA_1 and patterning device MA_2 with lithographic apparatus LA_2. The step 232 may be capable of predicting, for example, that patterning device MA_1 is compatible only with lithographic apparatus LA_2 while patterning device MA_2 is compatible with both lithographic apparatuses LA_1 and LA_2. In this example, the step 234 may be capable of making a decision to use the following combinations: patterning device MA_1 with lithographic apparatus LA_2 and patterning device MA_2 with lithographic apparatus LA_1.

In an embodiment, the present disclosure may form part of a patterning device inspection apparatus. The patterning device inspection apparatus may use EUV radiation to illuminate a patterning device (e.g., a mask) and use an imaging sensor to monitor radiation reflected from the patterning device. Images received by the imaging sensor are used to determine whether or not defects are present in the patterning device. The patterning device inspection apparatus may include optics (e.g. mirrors) configured to receive EUV radiation from an EUV radiation source and form it into a radiation beam to be directed at a patterning device. The patterning device inspection apparatus may further include optics (e.g. mirrors) configured to collect EUV radiation reflected from the patterning device and form an image of the patterning device at the imaging sensor. The patterning device inspection apparatus may include a processor configured to analyze the image of the patterning device at the imaging sensor, and to determine from that analysis whether any defects are present on the patterning device. The processor may further be configured to determine whether a detected patterning device defect will cause an unacceptable defect in images projected onto a substrate when the patterning device is used by a lithographic apparatus.

In an embodiment, the present disclosure may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the present disclosure in the context of a lithographic apparatus, embodiments of the present disclosure may be used in other apparatus. Embodiments of the present disclosure may form part of a patterning device inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. Although the described examples depict a lithographic apparatus LA including a patterning device MA (e.g. a reflection-based patterning device MA) for imparting a radiation beam reflected therefrom with a pattern to form the patterned radiation beam, it will be appreciated that at least one feature or method of the present disclosure may equally be applied in any other type of lithographic apparatus LA, for example, a lithographic apparatus utilizing a transmission-based patterning device MA for imparting a radiation beam transmitted therethrough with a pattern to form a patterned radiation beam.

The term "EUV radiation" may be considered to encompass electromagnetic radiation having a wavelength within the range of about 4 to about 20 nm, for example within the range of about 13 to about 14 nm. EUV radiation may have a wavelength of less than 10 nm, for example within the range of about 4 to about 10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Any of the methods described herein may comprise one or more selected from the: slit uniformity determination operation, slit uniformity optimization operation, slit uniformity fine tuning operation, pupil determination operation, pupil optimization operation, pupil correction operation, and/or the like. Any of the depicted methods, systems or apparatus may be used to perform or implement any operation described herein. For example, the processor 106 may be configured to implement any operation described herein. Alternatively or in addition, the processor 106 may be configured to control the controller CT as part of any operation described herein. Any method or operation described herein may be combined with any other method or operation described herein.

Various references in this disclosure are made to using a determined intensity distribution to calculate a non-uniformity of intensity caused by contamination and/or degradation of the collector 5. However, it will be appreciated that even for a non-contaminated and/or degradation-free collector 5, the intensity may be initially uniform or initially non-uniform, for example, with smooth variations in intensity. At least one method of the present disclosure may be capable of identifying or calculating a non-uniformity or change of non-uniformity of intensity caused by contamination and/or degradation of the collector 5.

Further embodiments are disclosed in the list of numbered embodiments below:

1. A method of determining compatibility of a patterning device with a lithographic apparatus, wherein the lithographic apparatus comprises:
    a collector to collect radiation emitted by a plasma to provide a radiation beam,
    an illumination system configured to receive and condition the radiation beam to form a conditioned radiation beam, and
    a projection system configured to image a patterned radiation beam to an image plane, wherein the patterned radiation beam is formed by the patterning device configured to impart the conditioned radiation beam with a pattern in its cross-section to form the patterned radiation beam,
    the method comprising:
    determining an intensity distribution of the radiation beam;
    using the determined intensity distribution to calculate a non-uniformity or change of non-uniformity of intensity caused by contamination and/or degradation of the collector;
    determining the effect of the non-uniformity or the change of non-uniformity on a characteristic of the image of the patterned radiation beam; and
    determining the compatibility of the patterning device with the lithographic apparatus based on the effect of the non-uniformity or change of non-uniformity on the characteristic.
2. The method of embodiment 1, comprising selecting the patterning device based on the effect of the contamination and/or degradation of the collector on the characteristic of the image.
3. The method of embodiment 1 or embodiment 2, comprising determining whether the characteristic of the image is within an acceptable tolerance range.
4. The method of any of embodiments 1 to 3, comprising identifying a patterning device that is compatible with the lithographic apparatus based on the effect of the non-uniformity or change of non-uniformity on the characteristic.

5. The method of embodiment 4, comprising selecting the patterning device from a database of patterning devices, wherein the selection is based on identifying a patterning device that is compatible with the lithographic apparatus based on the effect of the non-uniformity or change of non-uniformity on the characteristic of the image.

6. The method of embodiment 5, wherein the database comprises pre-defined combinations of patterning devices and pupil shapes that are compatible with each other.

7. The method of embodiment 6, comprising determining if a pre-defined combination of patterning device and pupil shape results in compatibility between the patterning device and the lithographic apparatus based on the determined effect of the non-uniformity or change of non-uniformity on the characteristic of the image.

8. The method of any of embodiments 1 to 7, comprising determining the compatibility of at least one patterning device with at least one lithographic apparatus based on the effect of the non-uniformity or change of non-uniformity on the characteristic for each of a plurality of lithographic apparatuses.

9. The method of embodiment 8, comprising identifying an optimum combination of the at least one patterning device and the at least one lithographic apparatus, and optionally the method comprises matching a patterning device with a lithographic apparatus based on which patterning device is compatible with the lithographic apparatus.

10. The method of embodiment 9, wherein identifying the optimum combination comprises identifying at least one patterning device that is compatible with at least one lithographic apparatus, and identifying at least one other patterning device that is compatible with at least one other lithographic apparatus.

11. The method of embodiment 9 or embodiment 10, comprising selecting the optimum combination of the at least one patterning device and the at least one lithographic apparatus.

12. The method of any of embodiments 1 to 11, comprising predicting a lifetime of the collector based on the effect of the contamination and/or degradation of the collector on the characteristic of the image.

13. The method of any of embodiments 1 to 12, comprising predicting when the non-uniformity of intensity caused by contamination and/or degradation of the collector is likely to affect the characteristic of the image of the patterning device such that the characteristic of the image falls outside an acceptable tolerance range for the patterning device.

14. The method of embodiment 13, comprising selecting a different patterning device for use before, during or after an incompatible patterning device forms an image that falls outside the acceptable tolerance range.

15. The method of embodiment 14, comprising identifying when the collector needs to be replaced, cleaned or serviced.

16. The method of any of embodiments 1 to 15, wherein determining the effect of the non-uniformity or change of non-uniformity on the characteristic of the image of the patterned radiation beam comprises predicting at least one selected from: a critical dimension (CD), critical dimension uniformity (CDU), a horizontal-vertical (HV) bias, a proximity bias average (PBA), a proximity bias range (PBR), feature orientation, iso/dense bias (IDB), or the like, of at least one feature of the image.

17. The method of any of embodiments 1 to 16, comprising determining a slit uniformity at an exposure slit formed by the radiation beam and calculating an effect of the slit uniformity on the characteristic of the image.

18. The method of embodiment 17, wherein the patterning device comprises a plurality of patterning device features, and the method comprises determining, based on the slit uniformity, an effect of at least one of the plurality of patterning device features on the characteristic of the image.

19. The method of embodiment 18, comprising calculating the effect of slit uniformity against exposure latitude, the exposure latitude being at least partially dependent on at least one of the plurality of patterning device features.

20. The method of any of embodiments 17 to 19, comprising identifying a compatible combination of patterning device and lithographic apparatus based on the effect of the slit uniformity on the characteristic of the image.

21. The method of any of embodiments 1 to 20, comprising determining a pupil intensity distribution at a pupil or pupil plane of the lithographic apparatus and calculating an effect of the pupil intensity distribution on the characteristic of the image.

22. The method of embodiment 21, wherein the patterning device comprises a plurality of patterning device features, and the method comprises determining, based on the pupil intensity distribution, an effect of at least one of the plurality of patterning device features on the characteristic of the image.

23. The method of embodiment 21 or embodiment 22, comprising identifying a compatible combination of patterning device and lithographic apparatus based on the effect of the pupil intensity distribution on the characteristic of the image.

24. The method of any of embodiments 1 to 23, comprising determining the intensity distribution of the radiation beam across a sensor plane of the illumination system.

25. The method of embodiment 24, wherein the sensor plane is chosen to enable reconstruction of the intensity distribution of the radiation beam at a pupil plane of the illumination system.

26. The method of any of embodiments 1 to 25, comprising determining the intensity distribution of the radiation beam optically downstream of the collector, and optionally comprises determining the intensity distribution of the radiation beam optically upstream of the patterning device, and/or optionally comprises determining the intensity distribution of the radiation beam optically upstream of the illumination system.

27. The method of any of embodiments 1 to 26, wherein the lithographic apparatus comprises a scrambler configurable to select or change an illumination mode or pupil shape of the radiation beam.

28. The method of embodiment 27, comprising determining the intensity distribution of the radiation beam optically upstream and/or optically downstream of the scrambler.

29. The method of embodiment 27 or embodiment 28, wherein the scrambler comprises an array of mirror elements.

30. The method of embodiment 29, comprising configuring the array of mirror elements to select or change the illumination mode or pupil shape of the radiation beam.

31. The method of embodiment 29 or embodiment 30, comprising configuring at least one of the mirror elements to change a pupil intensity distribution.

32. The method of embodiment 31, comprising determining the pupil intensity distribution and using the determined pupil intensity distribution to calculate at least one characteristic of the image.

33. The method of any of embodiments 29 to 32, comprising configuring at least one of the mirror elements to remove a portion of the radiation beam corresponding to a sharp change in reflectivity on the collector so that the portion of the radiation beam does not illuminate the patterning device.

34. The method of any of embodiments 27 to 33, wherein the lithographic apparatus comprises an array of pupil elements, the scrambler being configured to reflect the radiation beam towards the array of pupil elements, and the method further comprises selecting a configuration of the scrambler to illuminate at least some of array of pupil elements.

35. The method of any of embodiments 27 to 34, comprising selecting or changing the illumination mode or pupil shape of the radiation beam to at least partially compensate for the effect of the contamination and/or degradation of the collector on the characteristic of the image.

36. The method of any of embodiments 27 to 35, wherein selecting or changing the illumination mode or pupil shape of the radiation beam comprises changing an angular intensity distribution of the radiation beam, and optionally comprises changing the angular intensity distribution at a sensor plane and/or a pupil plane of the illumination system.

37. The method of any of embodiments 27 to 36, wherein selecting or changing the illumination mode or pupil shape of the radiation beam comprises changing a spatial intensity distribution of the radiation beam, and optionally comprises changing the spatial intensity distribution at the image plane and/or a field plane of the illumination system.

38. The method of any of embodiments 27 to 37, comprising determining a propagation path for a plurality of beam portions of the radiation beam propagating via the scrambler, the scrambler being configurable to change a direction of the propagation path of each of the plurality of beam portions, and optionally the scrambler is configurable to independently change the direction of the propagation path of at least one of the plurality of beam portions.

39. The method of embodiment 38, comprising determining the propagation path of at least one of the plurality of beam portions between the collector and a sensor plane and/or a pupil plane of the illumination system.

40. The method of embodiment 39, comprising using at least one selected from:
   a backwards ray tracing algorithm to calculate the propagation path of the plurality of beam portions from the sensor plane and/or pupil plane to the collector; and/or
   a forward ray tracing algorithm to calculate the propagation path of the plurality of beam portions from the collector to the sensor plane and/or pupil plane.

41. The method of embodiment 39 or embodiment 40, comprising using a known or selected illumination mode or pupil shape of the radiation beam produced by the scrambler to determine the propagation path of the plurality of beam portions, and optionally comprising determining the propagation path for each of the beam portions between the scrambler and the sensor plane and/or pupil plane, and optionally comprising determining a one-to-one optical relation defined by the plurality of beam portions between the scrambler and the sensor plane and/or pupil plane.

42. The method of any of embodiments 39 to 41, comprising using a ray tracing algorithm to trace the propagation path of the plurality of beam portions based on an intensity distribution measured in the sensor plane and/or pupil plane, and reconstructing an intensity profile of the radiation beam at a far field plane of the illumination system.

43. The method of any of embodiments 38 to 42, comprising determining the propagation path of the plurality of beam portions between the collector and the image plane and/or a field plane of the illumination system.

44. The method of embodiment 43, comprising using at least one selected from:
   a backwards ray tracing algorithm to calculate the propagation path of the plurality of beam portions from the image plane and/or the field plane to the collector; and/or
   a forward ray tracing algorithm to calculate the propagation path of the plurality of beam portions from the collector to the image plane and/or the field plane.

45. The method of embodiment 43 or embodiment 44, comprising using a known or selected illumination mode or pupil shape of the radiation beam produced by the scrambler to determine the propagation path of the plurality of beam portions, and optionally comprising determining the propagation path for each of the beam portions between the scrambler and the image plane and/or the field plane.

46. The method of any of embodiments 1 to 45, comprising using at least one selected from:
   a backwards ray tracing algorithm to calculate at least one propagation path of the radiation beam between the image plane, field plane, far-field plane, sensor plane and/or pupil plane, and the collector; and/or
   a forward ray tracing algorithm to calculate at least one propagation path of the radiation beam between the collector and the image plane, field plane, far-field plane, sensor plane and/or pupil plane, and
   optionally comprising calculating the at least one propagation path between a scrambler of the illumination system and the image plane, field plane, far-field plane, sensor plane and/or pupil plane.

47. The method of embodiment 46, comprising at least one selected from:
   using the forward ray tracing algorithm to determine the intensity distribution of the radiation beam in at least one selected from: the image plane and/or a field plane and/or a far-field plane of the radiation beam; and/or
   using the forward ray tracing algorithm to determine the effect of the non-uniformity or change of non-uniformity on the characteristic of the image of the patterned radiation beam, and
   optionally using the forward ray tracing algorithm to determine the compatibility of the patterning device with the lithographic apparatus based on the effect of the non-uniformity or change of non-uniformity on the characteristic.

48. The method of embodiment 46 or embodiment 47, comprising determining the intensity distribution at a sensor plane and/or pupil plane of the illumination system, and using the backwards ray tracing algorithm to calculate the non-uniformity of intensity caused by contamination and/or degradation of the collector, and optionally comprising using a known or selected configuration of a scrambler of the illumination system to determine a plurality of propagation paths of the radiation beam between the sensor plane and/or pupil plane and the collector, via the scrambler.

49. The method of any of embodiments 1 to 48, comprising determining the intensity distribution of the radiation beam and linking the intensity distribution within an angular range thereof with a corresponding spatial position of the collector, and optionally comprising determining the intensity distribution of the radiation beam across a sensor plane and/or pupil plane of the illumination system.

50. The method of embodiment 49, comprising using the intensity distribution within the angular range to determine the contamination and/or degradation at a corresponding spatial position of the collector.

51. The method of embodiment 49 or embodiment 50, comprising determining the contamination and/or degradation at a plurality of spatial positions of the collector.

52. The method of any of embodiments 1 to 51, comprising positioning a sensor to determine the intensity distribution of the radiation beam, and using the sensor to determine the intensity distribution.

53. The method of embodiment 52, comprising positioning the sensor at: the sensor plane and/or pupil plane, image plane, field plane and/or any other plane in the illumination system.

54. The method of embodiment 52 or embodiment 53, comprising positioning an aperture, for example a pinhole, at the image plane and/or a field plane of the illumination system, and optionally comprising using the aperture to sample part of the radiation beam.

55. The method of any of embodiments 1 to 54, comprising exposing a substrate to the patterned radiation beam.

56. The method of any of embodiments 1 to 55, wherein the lithographic apparatus comprises the patterning device configured to impart the conditioned radiation beam with the pattern in its cross-section to form the patterned radiation beam.

57. A computer program comprising instructions which, when executed on at least one processor, cause the at least one processor to control an apparatus to carry out the method according to any of embodiments 1 to 56.

58. A carrier containing the computer program of embodiment 57, wherein the carrier is one of an electronic signal, an optical signal, a radio signal, or a non-transitory computer readable storage medium.

59. A lithographic apparatus comprising:
   a collector to collect radiation emitted by a plasma to provide a radiation beam;
   an illumination system configured to receive and condition the radiation beam;
   a support structure constructed to support a patterning device, the patterning device being capable of imparting the radiation beam with a pattern in its cross-section to form a patterned radiation beam;
   a substrate table constructed to hold a substrate;
   a projection system configured to image the patterned radiation to an image plane;
   a sensor configured to determine an intensity distribution of the radiation beam; and
   a processor configured to at least:
      use the determined intensity distribution to calculate a non-uniformity or change of non-uniformity of intensity caused by contamination and/or degradation of the collector,
      determine the effect of the non-uniformity or change of non-uniformity on a characteristic of the image of the patterned radiation beam, and
      determine the compatibility of the patterning device with the lithographic apparatus based on the effect of the non-uniformity or change of non-uniformity on the characteristic.

60. The lithographic apparatus of embodiment 59, wherein the illumination system further comprises a scrambler configurable to select or change an illumination mode or pupil shape of the radiation beam.

61. A method of compensating contamination and/or degradation of an optical element of a lithographic apparatus, wherein the lithographic apparatus comprises:
   a collector to collect radiation emitted by a plasma to provide a radiation beam,
   an illumination system configured to receive and condition the radiation beam to form a conditioned radiation beam,
   a scrambler configurable to select or change an illumination mode or pupil shape of the radiation beam, wherein the scrambler comprises an array of mirror elements, and
   a projection system configured to image a patterned radiation beam to an image plane, wherein the patterned radiation beam is formed by the patterning device configured to impart the conditioned radiation beam with a pattern in its cross-section to form the patterned radiation beam,
   the method comprising:
   determining an intensity distribution of the radiation beam;
   using the determined intensity distribution to calculate a non-uniformity, or change of non-uniformity, of intensity caused by contamination and/or degradation of the collector; and
   configuring at least one of the mirror elements to reduce the non-uniformity of intensity.

62. The method of embodiment 61, comprising configuring the array of mirror elements to select or change the illumination mode or pupil shape of the radiation beam.

63. The method of embodiment 61 or embodiment 62, comprising configuring at least one of the mirror elements to change a pupil intensity distribution.

64. The method of embodiment 63, comprising determining the pupil intensity distribution and using the determined pupil intensity distribution to calculate at least one characteristic of the image.

65. The method of any of embodiments 61 to 64, comprising configuring at least one the mirror elements to remove a portion of the radiation beam corresponding to a sharp change in reflectivity on the collector so that the portion of the radiation beam does not illuminate the patterning device.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of a method described herein.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the present disclosure may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

While specific embodiments of the present disclosure have been described above, it will be appreciated that the present disclosure may be practiced otherwise than as described. The descriptions above are intended to be illustrative, not limiting. Thus it will be apparent to one skilled in the art that modifications may be made to the present disclosure as described without departing from the scope of the claims set out below.

The invention claimed is:

1. A method of determining compatibility of a patterning device with a lithographic apparatus, wherein the lithographic apparatus comprises:
    a collector to collect radiation emitted by a plasma to provide a radiation beam,
    an illumination system configured to receive and condition the radiation beam to form a conditioned radiation beam, and
    a projection system configured to image a patterned radiation beam to an image plane, wherein the patterned radiation beam is formed by the patterning device configured to impart the conditioned radiation beam with a pattern in its cross-section to form the patterned radiation beam,
    the method comprising:
    determining an intensity distribution of the radiation beam;
    using the determined intensity distribution to calculate a non-uniformity or change of non-uniformity of intensity caused by contamination and/or degradation of the collector;
    determining the effect of the non-uniformity or the change of non-uniformity on a characteristic of the image of the patterned radiation beam;
    determining the compatibility of the patterning device with the lithographic apparatus based on the effect of the non-uniformity or change of non-uniformity on the characteristic; and
    based on the determining the compatibility, outputting information indicating that a patterning device being used, or going to be used, with the collector should not be used with the collector or indicating that a patterning device not being used with the collector should be used with the collector.

2. The method of claim 1, comprising selecting the patterning device based on the effect of the contamination and/or degradation of the collector on the characteristic of the image.

3. The method of claim 1, further comprising identifying a patterning device that is compatible with the lithographic apparatus based on the effect of the non-uniformity or change of non-uniformity on the characteristic.

4. The method of claim 1, further comprising determining the compatibility of at least one patterning device with at least one lithographic apparatus based on the effect of the non-uniformity or change of non-uniformity on the characteristic for each of a plurality of lithographic apparatuses.

5. The method of claim 4, further comprising identifying an optimum combination of the at least one patterning device and the at least one lithographic apparatus.

6. The method of claim 1, further comprising predicting when the non-uniformity of intensity caused by contamination and/or degradation of the collector is likely to affect the characteristic of the image of the patterning device such that the characteristic of the image falls outside an acceptable tolerance range for the patterning device.

7. The method of claim 1, wherein determining the effect of the non-uniformity or change of non-uniformity on the characteristic of the image of the patterned radiation beam comprises predicting at least one selected from: a critical dimension (CD), critical dimension uniformity (CDU), a horizontal-vertical (HV) bias, a proximity bias average (PBA), a proximity bias range (PBR), feature orientation, iso/dense bias (IDB), or the like, of at least one feature of the image.

8. The method of claim 1, comprising determining a slit uniformity at an exposure slit formed by the radiation beam and calculating an effect of the slit uniformity on the characteristic of the image.

9. The method of claim 1, further comprising determining a pupil intensity distribution at a pupil or pupil plane of the lithographic apparatus and calculating an effect of the pupil intensity distribution on the characteristic of the image.

10. The method of claim 1, further comprising determining the intensity distribution of the radiation beam optically downstream of the collector, determining the intensity distribution of the radiation beam optically upstream of the patterning device, and/or determining the intensity distribution of the radiation beam optically upstream of the illumination system.

11. The method of claim 1, wherein the lithographic apparatus comprises a scrambler configurable to select or change an illumination mode or pupil shape of the radiation beam.

12. The method of claim 11, wherein the scrambler comprises an array of mirror elements.

13. The method of claim 12, further comprising configuring at least one of the mirror elements to change a pupil intensity distribution.

14. A method of compensating contamination and/or degradation of a lithographic apparatus, wherein the lithographic apparatus comprises:
    a collector to collect radiation emitted by a plasma to provide a radiation beam,
    an illumination system configured to receive and condition the radiation beam to form a conditioned radiation beam,
    a scrambler configurable to select or change an illumination mode or pupil shape of the radiation beam, wherein the scrambler comprises an array of mirror elements, and
    a projection system configured to image a patterned radiation beam to an image plane, wherein the patterned radiation beam is formed by the patterning device configured to impart the conditioned radiation beam with a pattern in its cross-section to form the patterned radiation beam,
    the method comprising:
    determining an intensity distribution of the radiation beam;
    using the determined intensity distribution to calculate a non-uniformity, or change of non-uniformity, of intensity caused by contamination and/or degradation of the collector; and
    configuring at least one of the mirror elements to reduce the non-uniformity of intensity,
    wherein the determining the intensity distribution comprises tracing contamination and/or degradation on different parts of the collector to different mirror elements of the array of mirror elements.

15. The method of claim 14, further comprising configuring the array of mirror elements to select or change the illumination mode or pupil shape of the radiation beam.

16. The method of claim 14, further comprising configuring at least one of the mirror elements to change a pupil intensity distribution.

17. The method of claim 16, further comprising determining the pupil intensity distribution and using the determined pupil intensity distribution to calculate at least one characteristic of the image.

18. The method of claim 14, further comprising configuring at least one the mirror elements to remove a portion of the radiation beam corresponding to a sharp change in reflectivity on the collector so that the portion of the radiation beam does not illuminate the patterning device.

19. A non-transitory storage medium comprising instructions stored therein, the instructions, when executed by at least one processor, configured to cause the at least one processor to at least:
    determine an intensity distribution of a radiation beam of a lithographic apparatus, wherein the lithographic apparatus comprises: a collector to collect radiation emitted by a plasma to provide the radiation beam, an illumination system configured to receive and condition the radiation beam to form a conditioned radiation beam, and a projection system configured to image a patterned radiation beam to an image plane, wherein the patterned radiation beam is formed by a patterning device configured to impart the conditioned radiation beam with a pattern in its cross-section to form the patterned radiation beam;
    use the determined intensity distribution to calculate a non-uniformity or change of non-uniformity of intensity caused by contamination and/or degradation of the collector;
    determine the effect of the non-uniformity or the change of non-uniformity on a characteristic of the image of the patterned radiation beam;
    determine compatibility of the patterning device with the lithographic apparatus based on the effect of the non-uniformity or change of non-uniformity on the characteristic; and
    based on the determination of the compatibility, output information indicating that a patterning device being used, or going to be used, with the collector should not be used to produce a patterned radiation beam using radiation from the contaminated and/or degraded collector or indicating that a patterning device not being used with the collector should be used with the collector.

20. A non-transitory storage medium comprising instructions stored therein, the instructions, when executed by at least one processor, configured to cause the at least one processor to at least:
    determine an intensity distribution of a radiation beam of a lithographic apparatus, wherein the lithographic apparatus comprises: a collector to collect radiation emitted by a plasma to provide the radiation beam, an illumination system configured to receive and condition the radiation beam to form a conditioned radiation beam, a scrambler configurable to select or change an illumination mode or pupil shape of the radiation beam, wherein the scrambler comprises an array of mirror elements, and a projection system configured to image a patterned radiation beam to an image plane, wherein the patterned radiation beam is formed by the patterning device configured to impart the conditioned radiation beam with a pattern in its cross-section to form the patterned radiation beam;
    use the determined intensity distribution to calculate a non-uniformity, or change of non-uniformity, of intensity caused by contamination and/or degradation of the collector; and
    configure at least one of the mirror elements to reduce the non-uniformity of intensity,
    wherein the determination of the intensity distribution comprises tracing of contamination and/or degradation on different parts of the collector to different mirror elements of the array of mirror elements.

* * * * *